United States Patent
Akinaga et al.

(10) Patent No.: US 7,964,924 B2
(45) Date of Patent: Jun. 21, 2011

(54) MAGNETORESISTANCE EFFECT DEVICE AND MAGNETISM SENSOR USING THE SAME

(75) Inventors: Hiroyuki Akinaga, Tsukuba (JP); Masaharu Oshima, Tokyo (JP); Masaki Mizuguchi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 519 days.

(21) Appl. No.: 10/514,711

(22) PCT Filed: May 24, 2002

(86) PCT No.: PCT/JP02/05070
§ 371 (c)(1),
(2), (4) Date: Dec. 28, 2005

(87) PCT Pub. No.: WO03/100877
PCT Pub. Date: Dec. 4, 2003

(65) Prior Publication Data
US 2006/0099437 A1    May 11, 2006

(51) Int. Cl.
*H01L 29/82* (2006.01)
(52) U.S. Cl. ......... 257/421; 257/E43.002; 257/E29.323; 360/324.1; 438/3
(58) Field of Classification Search ............... 257/108, 257/414, 421, 422, 429, 431, E43.004, E29.167, 257/E29.323, E43.002; 438/3, 57; 360/113, 360/324.1, 313
See application file for complete search history.

(56) References Cited

U.S. PATENT DOCUMENTS

| | | | |
|---|---|---|---|
| 4,288,708 A | | 9/1981 | Vinal |
| 5,783,284 A | * | 7/1998 | Shinjo et al. .............. 428/811.2 |
| 6,016,241 A | * | 1/2000 | Coffey et al. .............. 360/324 |
| 6,146,761 A | | 11/2000 | Hirotsu et al. |
| 6,162,532 A | * | 12/2000 | Black et al. .................. 428/323 |
| 6,353,317 B1 | * | 3/2002 | Green et al. .................. 324/252 |
| 6,381,171 B1 | * | 4/2002 | Inomata et al. ............... 365/173 |

(Continued)

FOREIGN PATENT DOCUMENTS

JP    2000340425    *    8/2000

(Continued)

OTHER PUBLICATIONS

Prabhawalker et al. ("Electron Diffraction Analysis of Antimony Films", Bull. Mater. Sci., vol. 6, No. 3, Jul. 1984, pp. 611-616).*

(Continued)

*Primary Examiner* — Thao X Le
*Assistant Examiner* — William F Kraig
(74) *Attorney, Agent, or Firm* — Oblon, Spivak, McClelland, Maier & Neustadt, L.L.P.

(57) ABSTRACT

A magneto-resistance effect device (1) includes a semiconductor region (2) having a surface provided with a plurality of isolated metal micro-particles (3) of not more than 100 μm disposed at intervals of not more than 1 μm, a semiconductor or half-metal cap layer (4) for covering the semiconductor region and a plurality of electrodes (5) disposed on a surface of the cap layer and separated from each other. The device exhibits a high magneto-resistance effect at room temperature, is highly sensible to a magnetic field and can be produced through a simple manufacturing process. The device is formed of a magneto-resistant material easy to match a semiconductor fabrication process. A magnetic field sensor using the device (1) has various excellent characteristics.

17 Claims, 15 Drawing Sheets

U.S. PATENT DOCUMENTS

| | | | |
|---|---|---|---|
| 6,610,421 B2 | 8/2003 | Akinaga et al. | |
| 6,613,448 B1 * | 9/2003 | Akinaga et al. | 428/611 |
| 6,808,740 B2 * | 10/2004 | Akinaga et al. | 427/127 |
| 7,180,713 B2 * | 2/2007 | Nagasaka et al. | 360/324.1 |
| 7,304,331 B2 * | 12/2007 | Saito et al. | 257/192 |
| 7,352,024 B2 * | 4/2008 | Iwata et al. | 257/314 |
| 2002/0030950 A1 * | 3/2002 | Sano et al. | 360/324.11 |

FOREIGN PATENT DOCUMENTS

| | | |
|---|---|---|
| JP | 2000-340425 | 12/2000 |
| JP | 2001-108951 | 4/2001 |
| JP | 2002-164589 | 6/2002 |

OTHER PUBLICATIONS

Tadayon et al. ("Characterization of Low Range GaAs", J. of Electronic Materials, vol. 24, No. 11, 1995).*

Akinaga, H. et al. "Room-temperature thousandfold magnetoresistance change in MnSb granular films: Magnetoresistive switch effect", Applied Physics Letters, vol. 76, No. 3, pp. 357-359, Jan. 2000.

Akinaga, H. et al. "Room-temperature photoinduced magnetoresistance effect in GaAs including MnSb nanomagnets", Applied Physics Letters, vol. 76, No. 18, pp. 2600-2602, May 2000.

Akinaga, H. et al. "Room-temperature thousandfold magnetoresistance change in MnSb granular films: Magnetoresistive switch effect", Applied Physics Letters, vol. 76, No. 3, pp. 357-359, Jan. 2000.

Mizuguchi, M. et al. "Crystallographic and magneto-optical studies of nanoscaled MnSb dots grown on GaAs", Applied Physics Letters, vol. 76, No. 13, pp. 1743-1745, Mar. 2000.

Akinaga, H. et al. "Room-temperature photoinduced magnetoresistance effect in GaAs including MnSb nanomagnets", Applied Physics Letters, vol. 76, No. 18, pp. 2600-2602, May 2000.

Akinaga, H. et al. "Room-Temperature Extra-huge Magnetoresistance Effect in MnSb Granular Films", Journal of Applied Magnetism, vol. 24, No. 4-2, pp. 451-454, with English translation 2000.

Mizuguchi, M. et al. "Formation of MnSb Granular Films and Their Magneto-optical Properties", Journal of Applied Magnetism, vol. 24, No. 4-2, pp. 499-502, with English translation 2000.

Pauw, L.J. van der. "A Method of Measuring the Resistivity and Hall Coefficient on Lamellae of Arbitrary Shape", Philips Technical Review, vol. 20, No. 8, pp. 220-224 1958/1959.

Behet, M. et al. "InAs/(Al,Ga)Sb Quantum Well Structures for Magnetic Sensors", IEEE Transactions on Magnetics, vol. 34, No. 4, pp. 1300-1302, Jul. 1998.

* cited by examiner

F I G. 1
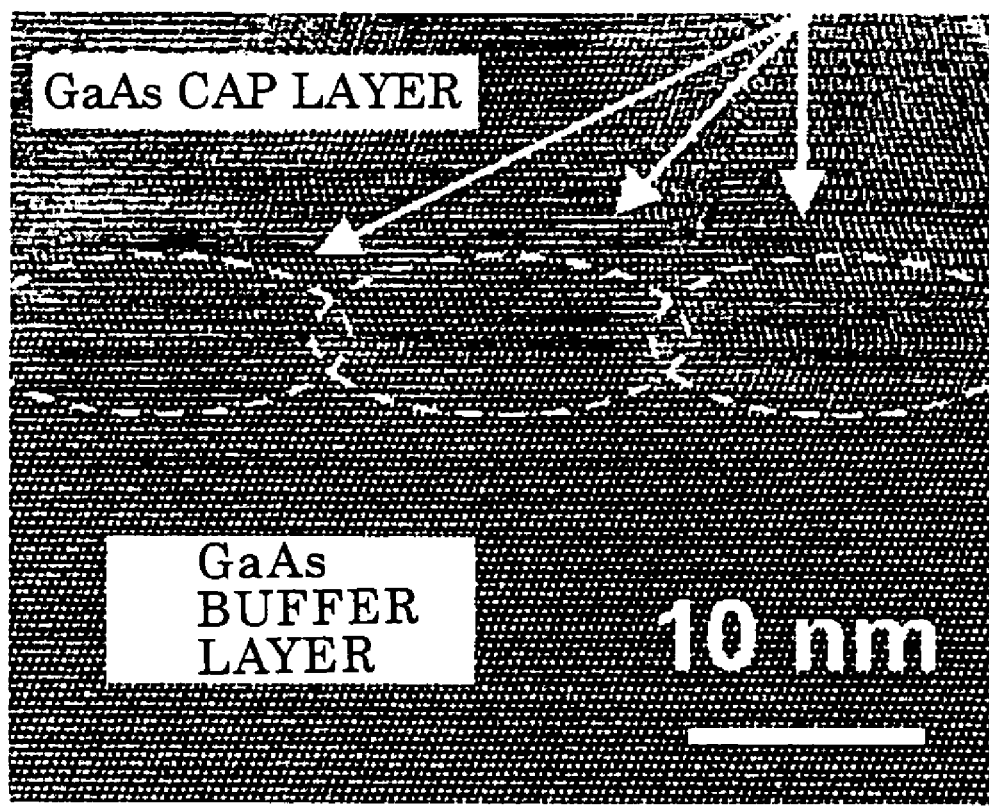

(a)

(b)

(c)

(a)

(b)

(c)

F I G. 14
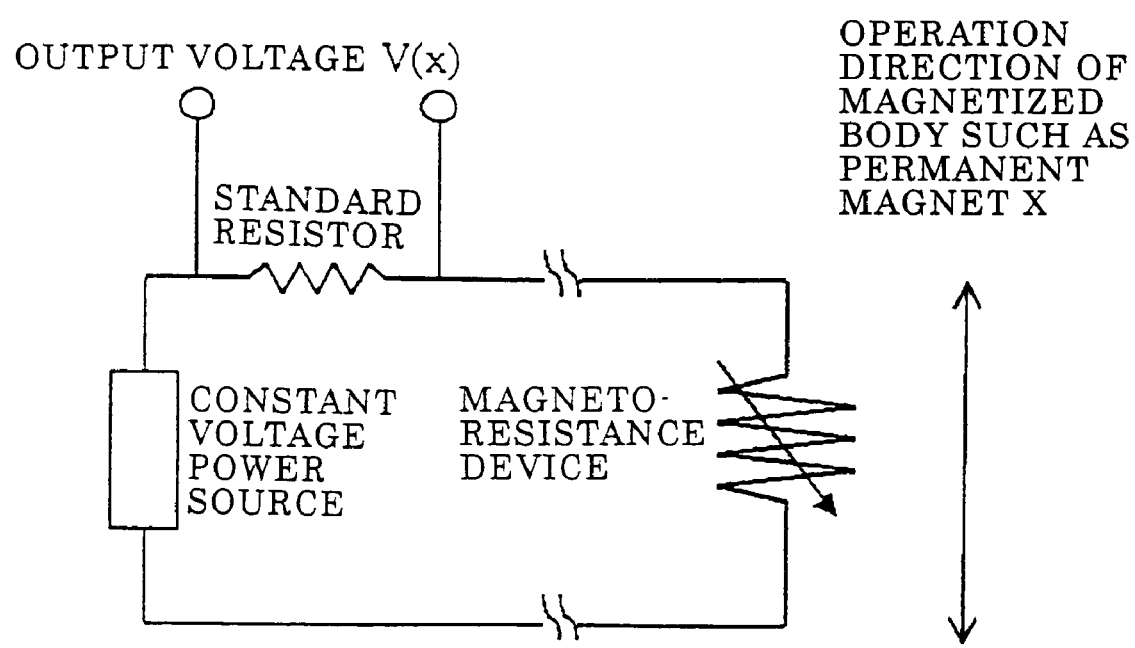

(a)

(b)

(a)

(b)

MAGNETORESISTANCE EFFECT DEVICE AND MAGNETISM SENSOR USING THE SAME

TECHNICAL FIELD

This invention relates to a magneto-resistance effect device comprising a semiconductor and micro-particles of metal and to a magnetic field sensor using the magneto-resistance effect device. Particularly, the invention relates to a magneto-resistance effect device using a magnetic filed to control a large resistance variation resulting from the electron avalanche effect and to a magnetic field sensor using the magneto-resistance effect device.

BACKGROUND ART

In recent years, studies have been actively made on magnetic field sensor devices being made highly sensitive, developments of magnetic memory devices, etc., utilizing a so-called magneto-resistance effect that is the effect of varying resistance with a change in external magnetic field. The competition among researchers and developers for these devices falling in one of the advanced technical fields that support the information technology developing at ever-progressing speed is being intensified.

The magneto-resistance materials have been developed using various kinds of materials having various structures. Magnetic metal alloys, such as Permalloy, have heretofore been used as materials for magnetic field sensors and magnetic heads. However, the magneto-resistance effect thereof has been at several % at most, and other materials have already been substituted in the present state of affairs.

As one of relatively new magneto-resistance materials, there can be cited a multi-layer structure alternating a magnetic substance and a non-magnetic substance. Attention has been paid to this multi-layer structure because it exhibits a considerably high magneto-resistance effect as compared with magnetic metal alloys. Next to this, studies have been made on a spin-valve structure having, as one unit, a ferromagnetic metal/insulator/ferromagnetic metal system. The spin-valve structure has already been applied to magnetic random access memories, etc. and put into practical use as products. In addition, development of quite new magneto-resistance materials has recently been going on with the aim of establishing materials exhibiting a further higher magneto-resistance effect.

The first condition for enhancing the performance of a device using the magneto-resistance effect is that the materials have a high rate of change in magneto-resistance (magneto-resistance ratio). Here, the magneto-resistance ratio is defined by a ratio of the change $\Delta R$ in magneto-resistance resulting from application of a magnetic field, which change is the difference between the maximum resistance value Rmax and the minimum resistance value Rmin, to Rmin, i.e. $\Delta R/R = 100 \times (Rmax - Rmin)/Rmin$ (%).

The second important condition is that the materials have high sensitivity to the magnetic field. When the materials are applied to electronic devices, such as a memory device, the devices have to be driven by application of a magnetic field of 100 Oe (oersted) that can be electrically generated with ease and that can also be generated within the devices. In order for the devices to be used as magnetic field sensors, such as an automobile speed sensor and a positioning sensor, the devices have to be driven by application of a magnetic field that can realize a magnetic field range that can be generated using a permanent magnet and that can take a distance between an appropriate sensor and the permanent magnet, i.e. not more than 1,000 Oe.

Though the high magneto-resistance ratio and high sensitivity of the materials are important characteristic values in developing devices, it is actually indispensable to industrialization using the materials that the materials have good compatibility with the existing semiconductor technologies. For example, materials that cannot be incorporated into a line of semiconductor fabrication using the main materials in the semiconductor technologies, such as silicon and gallium arsenic, or materials requiring great labor for the incorporation are disadvantageous from the standpoint of the industrialization. In most cases, materials containing magnetic metal elements, such as iron, chromium and cobalt, are not suitable for the industrialization. Furthermore, it is greatly demanded from the economical point of view to simplify the device-fabricating steps.

It goes without saying that it is difficult for the devices to be used as actual magneto-resistance effect devices insofar as the characteristics of the devices cannot be manifested at room temperature.

TABLE 1-I

| Nr. | Features of magneto-resistance effect device | Magneto-resistance ratio (room temp.) | Required magnetic field (Oe) | Process-matching with LSI | Room-temp. operation | Reference material |
|---|---|---|---|---|---|---|
| a | Permalloy | 2.5 | 1,500 | Possible | Possible | JMMM, Vol. 83, p. 113 (1990) |
| b | Magnetic resistance multi-film | 65 | 10,000 | Possible | Possible | APL, Vol. 58, p. 2710 (1991) |
| c | Spin valve film 1 | 20 | <100 | Possible | Possible | JAP, Vol. 81, p. 3741 (1997) |
| d | Spin valve film 2 | 10 | <100 | Possible | Possible | JP-A 2000-150985 |
| e | Granular magnetic film | 20 | 1,000 | Possible | Possible | JP-A 2000-156531 |
| f | Uranium compound | 500 | 20,000 | Impossible | Impossible | JMMM, Vol. 104-107, p. 19 (1992) |
| g | Perovskite oxide film 1 | $10^{10}$ | 70,000 | Impossible | Impossible | U.S. Pat. No. 5,665,664 |
| h | Perovskite oxide film 2 | 10 | 70,000 | Impossible | Possible | Nature, Vol. 57, p. 291 (1990) |
| i | Indium antimony | 300 | 10,000 | Suitable | Possible | APL, Vol. 57, p. 291 (1990) |
| j | Semiconductor hetero-structure | 20 | 1,000 | Suitable | Possible | IEEE, Trans. Magn. Vol. 34, p. 1300 (1998) |
| k | Mercury compound semiconductor | 10 | 1,000 | Possible | Possible | JP-A HEI 11-112057 |
| l | Indium antimony | 100 | 500 | Possible | Possible | ICPS abstract book part II, p. 342 (2000) |
| m | MnSb granular film 1 | 3,500 | 5,000 | Possible | Possible | JP-A HEI 11-204443, JP-A HEI 11-82062 USP pending |
| n | MnSb granular film 2 | 7,300 | 15,000 | Possible | Possible | JP-A HEI 11-204443, JP-A HEI 11-82062 USP pending |

TABLE 1-I-continued

| Nr. | Features of magneto-resistance effect device | Magneto-resistance ratio (room temp.) | Required magnetic field (Oe) | Process-matching with LSI | Room-temp. operation | Reference material |
| --- | --- | --- | --- | --- | --- | --- |
| o | Invention thin film 1 | 450 | 30 | Suitable | Possible | FIG. 5 |
| p | Invention thin film 2 | 2,200 | 500 | Suitable | Possible | FIG. 5 |
| q | Invention thin film 3 | 9,000 | 1,000 | Suitable | Possible | FIG. 5 |
| r | Invention thin film 4 | >100,000 | 7,000 | Suitable | Possible | FIG. 5 |

As is clear from Table 1, the materials exhibiting high magneto-resistance effect, such as materials f, g and h in Table 1, have drawbacks that these can only operate at low temperatures and that these require an extremely high magnetic field. Materials i and j in Table 1 that suitably match a semiconductor device-fabricating process, when operated under a magnetic field of not more than 100 Oe, these produce a very small output of electrical signal. Materials c and d in Table 1 that are applied to electronic devices exhibit a low magneto-resistance ratio.

The inventors recently discovered a new magneto-resistance effect. This effect is manifested when the electron avalanche phenomenon occurring in a magneto-resistance material is frozen through application of a magnetic field. The inventors named this phenomenon a magneto-resistance switching phenomenon and disclosed it in detail in Applied Physics Letters, Vol. 76, No. 3 (2000) 357; Applied Physics Letters, Vol. 76, No. 13 (2000) 1743; Applied physics Letters, Vol. 76, No. 18 (2000) 2600; Journal of Applied Magnetism, Vol. 24, No. 4-2 (2000) 451; and Journal of Applied Magnetism, Vol. 24, No. 4-2 (2000) 499.

As described above, the conventional magneto-resistance devices could only operate at low temperatures or required an extremely high magnetic field. In the case of the conventional devices suitable for mass production, a signal was too small to use them under a practical magnetic field of not more than 100 Oe. The conventional devices applied to electronic devices had a small magneto-resistance ratio.

In view of the above, the present invention has been accomplished, and its object is to provide a magneto-resistance effect device exhibiting a very high magneto-resistance effect at room temperature and therefore exhibiting high sensitivity to a magnetic field.

Another object of the invention is to provide a magneto-resistance effect device capable of being produced through a simple production process.

Still another object of the invention is to provide a magneto-resistance effect device formed of a magneto-resistance material easy to match a semiconductor-fabricating process.

Yet another object of the invention is to provide a magnetic field sensor using any of the magneto-resistance devices mentioned above, such as a magnetic field sensor device, magnetic memory, magnetic switching device or other such device.

DISCLOSURE OF THE INVENTION

The invention provides a magneto-resistance effect device comprising a semiconductor region having a surface provided with a plurality of isolated metal micro-particles of not more than 100 μm disposed at intervals of not more than 1 μm, a semiconductor or half-metal cap layer (4) for covering the semiconductor region, and a plurality of electrodes (5) disposed on a surface of the cap layer and separated from each other.

In the magneto-resistance effect device, the metal micro-particles are gold or aluminum micro-particles, the semiconductor region is formed of a III-V Group semiconductor, and the cap layer is formed of antimony, gallium arsenic or bismuth.

The invention also provides a magnetic field sensor using the magneto-resistance effect device, comprising a constitution that causes a change in intensity of a magnetic field in the surface of the semiconductor region between the electrodes and a constitution that senses a variation in electric resistance between the electrodes.

The magnetic field sensor can further comprise a constitution that adjusts voltage between the electrodes or adjusts a bias magnetic field for adjusting the magnetic field intensity in the surface of the semiconductor region to increase the variation in electric resistance between the electrodes resulting from the change of the magnetic field intensity, a constitution that can operate the magnetic field sensor in a region in which an electron avalanche phenomenon occurs between the electrodes and a constitution that enables the variation in electric resistance between the electrodes resulting from the change in magnetic field intensity to operate the magnetic field sensor in a region having hysteresis characteristics.

The magnetic field sensor can further comprise a constitution that changes intensity of light irradiated on the surface of the semiconductor region between the electrodes and a constitution that adjusts voltage between the electrodes, adjusts a bias magnetic field for adjusting the magnetic field intensity in the surface of the semiconductor region or adjusts the intensity of the irradiated light to increase the variation in electric resistance between the electrodes resulting from the change of the magnetic field intensity or from the change of the light intensity.

The magnetic field sensor can further comprise a constitution that adjusts voltage between the electrodes, adjusts a bias magnetic field for adjusting the magnetic field intensity in the surface of the semiconductor region or adjusts the intensity of the irradiated light to enable the variation in electric resistance between the electrodes resulting from the change of the magnetic field intensity or from the change of the light intensity to operate the magnetic field sensor in a region having hysteresis characteristics and a constitution that can operate the magnetic field sensor in a region in which an electron avalanche phenomenon occurs between the electrodes.

The magnetic field sensor can further comprise a constitution that exerts a magnetic field onto the surface of the semiconductor region between the electrodes, a constitution that applies voltage between the electrodes and a constitution that extracts an output including a vibration component from an electric current flowing between the electrodes.

As described above, the magneto-resistance effect device of the present invention exhibits a high magneto-resistance effect at room temperature, is highly sensible to a magnetic field and can be produced through a simple process in spite of the fact that the fundamental structure thereof is a very simple structure having a multiplicity of metal particles dispersed on a semiconductor substrate.

The magnetic field sensor using the magneto-resistance effect device also has various excellent characteristics as mentioned above.

BRIEF DESCRIPTION OF THE DRAWINGS

FIG. 1 is a diagram showing a sectioned image of a magneto-resistance effect device according to the present invention, observed through a scanning electron microscope.

FIG. 14 is a circuitry showing one embodiment of a magneto-resistance effect device used as a magnetic field sensor device.

BEST MODE FOR CARRYING OUT THE INVENTION

An embodiment of the magneto-resistance effect device will first be described and an embodiment of the magnetic field sensor using the magneto-resistance effect device will then be described.

Figure 13:
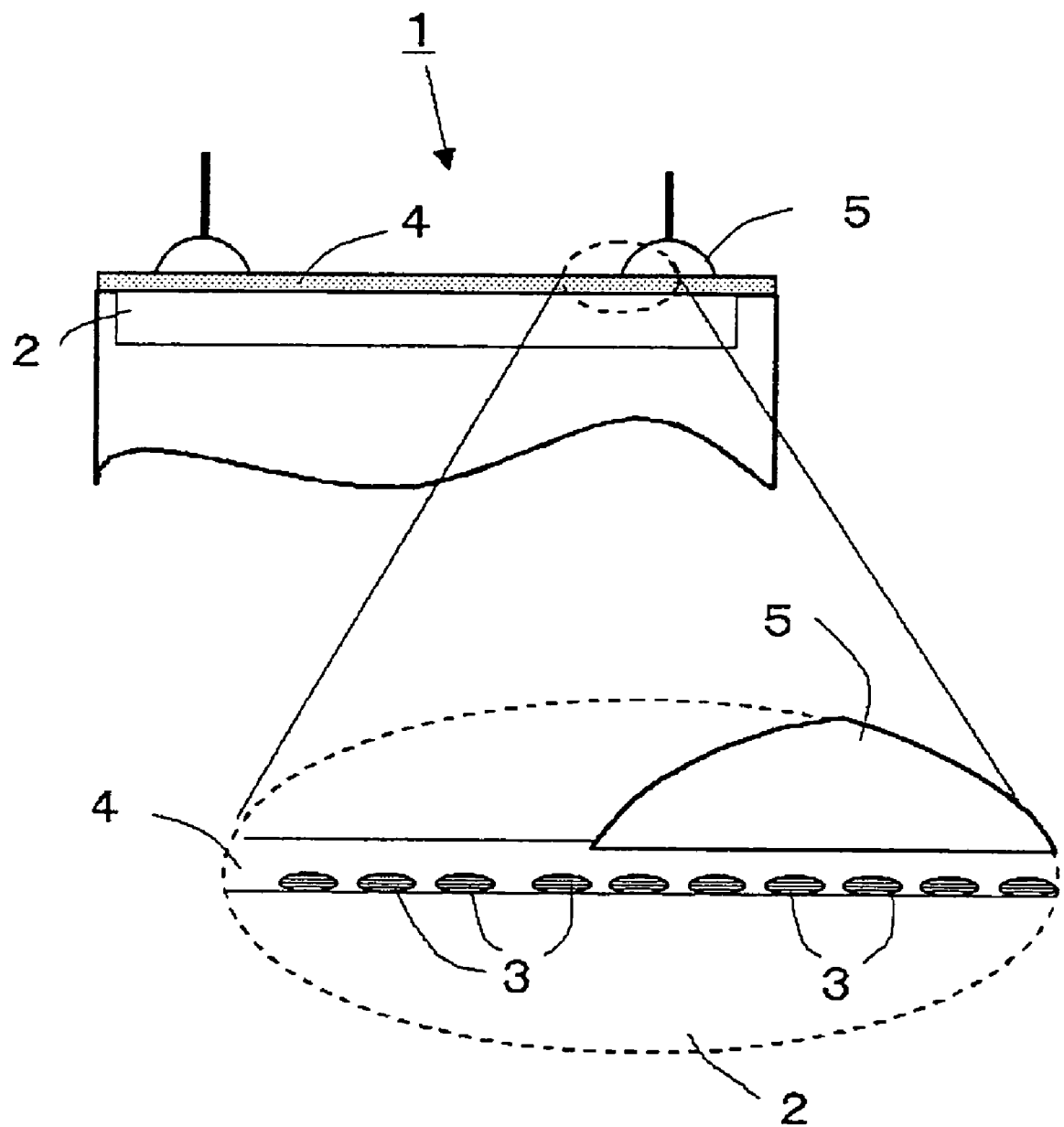
FIG. 13 is a schematic view showing the cross section of a magneto-resistance effect device.

A magneto-resistance effect device 1 of the present invention has a structure shown in FIG. 13, in which a semiconductor substrate 2 has a multiplicity of metal micro-particles 3 dispersed thereon and covered by an ultra-thin, semiconductor or half-metal, cap layer 4, and has as an operation principle a magneto-resistance effect that varies the resistance of the granular thin layer through application of a magnetic field.

The magneto-resistance effect device 1 exhibits a magneto-resistance effect one order higher than that obtained from an existing device even in a magnetic field of 100 Oe or less. Varying the voltage applied between the two electrodes 5 shown in FIG. 13 enables the magneto-resistance ratio of the device to be adjusted to conform to the magnetic field intensity. Furthermore, since the device contains no magnetic element that would be a contaminant in a semiconductor fabrication process, introduction of the device into an existing semiconductor fabrication process is easy to perform. The manufacturing process of the device is also easy to perform. These characteristics are those of a novel magneto-resistance effect device considerably enhanced in performance as compared with the existing devices shown in Table 1.

The magneto-resistance effect device 1 comprises a semiconductor substrate 2 having a surface provided with a plurality of isolated metal micro-particles 3 of not more than 100 μm disposed in a non-contact state at intervals of not more than 1 μm, and a cap layer having a thickness of 1 to 100 nm. More preferably, the plural metal micro-particles of not more than 1 μm are isolated in a non-contact state at intervals in the range of 1 to 100 nm, and the cap layer has a thickness of 1 to 100 nm. Though the metal micro-particles may have a spherical convexo-plane or rectangular shape insofar as the intervals thereof fall in the aforementioned range.

To be specific, the semiconductor substrate 2 is formed of gallium arsenide (GaAs); a combination of the metal micro-particles 3 and the cap layer 4 is formed of gold (Au) and antimony (Sb), aluminum (Al) and antimony (Sb), gold (Au) and gallium arsenide (GaAs) or aluminum (Al) and antimony (Sb); and the electrodes are formed of indium (In), gold (Au), silver (Ag), copper (Cu) or aluminum (Al). As an alternative, the semiconductor substrate is a Group III-V semiconductor substrate, in which the Group III element is at least one member selected from the group consisting of Ga, Al and In, and the Group V element is As. The cap layer may be formed of semi-metal, such as Bi.

In the present invention, why the size of the metal micro-particles is restricted to the range of 1 to 100 nm and why the metal micro-particles are isolated in a non-contact state are that devices, if the size thereof is on the order of nm, can be used and that failure to manifest a desired magneto-resistance effect resulting from dominant electric conduction through the metal micro-particles arising when the metal micro-particles come into intimate contact with each other is prevented, respectively.

The summary of the manufacturing process for the magneto-resistance effect device will be described.

A semiconductor substrate can be fabricated through any one of the molecular beam epitaxy method, electron beam deposition method, sputtering method, electrodeposition method and other such methods. Any one of the methods is used to form a semiconductor region of high resistance and metal micro-particles are then dispersed onto the substrate. Thereafter, a cap layer is formed. It has already known that metal micro-particles can be formed utilizing a difference in crystallo-engineering lattice constant, a surface energy difference between a substrate and metal or a process of material phase separation.

The structure of the metal micro-particles or cap layer can be evaluated using a scanning electron microscope, a transmission electron microscope, a scanning probe microscope or other such microscope. FIG. 1 shows the sectioned image of the magneto-resistance effect device observed using a scanning electron microscope. It can be understood from the image of the scanning electron microscope that the metal micro-particles having a length of around 10 nm are disposed at intervals of around 1 to 2 nm. It is desirable that an insulator film of silicon oxide, silicon nitride or other such material be coated on the surface of the magneto-resistance effect device for the purpose of oxidization prevention or insulation to the electrodes.

The electro-resistance effect device is also provided with a plurality of electrodes for use in reading a variation in resistance of the device. These electrodes can be formed of In, Au, Cu, Al or other such metal. An electric current is allowed to flow between the electrodes to detect the magneto-resistance effect. Though the electric current induces the electron avalanche phenomenon in the magneto-resistance effect device of the present invention, application of a magnetic field enables the avalanche phenomenon to be frozen to thereby induce a large magneto-resistance effect in comparison with conventional devices.

As a method of measuring resistance between electrodes, the 4-probe method using four electrodes, two of which are disposed between two face-to-face electrodes for measuring voltage, 2-probe method using a voltage terminal and a current terminal in common with each other, vander Pauw method (Philips Technical Review, Vol. 20, No. 8, p. 220 (1958/1959)), multi-probe method, cobinotron probe method and Hall element method (IEEE Transactions on Magnetics, Vol. 34, No. 4, p. 1300 (1998)) have been well known. Therefore, array of electrodes is determined depending on the kind of the measurement methods. In the case of a magneto-resistance effect device exhibiting anisotropy, electrodes are arranged in accordance with the anisotropy to read a magneto-resistance effect by a difference in mutual array, thereby enabling the direction of magnetism to be known.

Voltage applied between the electrodes is that of such a value as enabling induction of an electron avalanche phenomenon. The value varies depending on the size and characteristic of a magneto-resistance effect device. For this reason, it is necessary to adjust the voltage to be applied between the electrodes in accordance with the distance between the electrodes and design a magneto-resistance effect device so that an output signal has a desirable value. To attain this, it is desirable that the magneto-resistance effect device be driven at a constant current. A resistor device can be substituted for the constant current source. In the embodiment of the present invention, the voltage is set to a proper value of not more than 110 V to clearly manifest the magneto-resistance effect. When utilizing the magneto-resistance effect device as an electronic device, it is desirable to enable the voltage to be set in accordance with applications thereof. In most cases, it is desirable to operate the device at a voltage as low as possible. To attain this, it is clear that the distance between the electrodes is made small.

A method for fabricating a magneto-resistance effect device of the present invention will be described herein below in detail.

The structure of the magneto-resistance effect device according to the present invention will be described with reference to the accompanying drawings. FIG. 1 shows an image of the cross section of the magneto-resistance effect device according to the present invention observed through a high-resolution transmission electron microscope. It is clear from the image that disc-shaped metal Al particles exist on a GaAs substrate, and onto the particles a GaAs cap layer is attached.

Though the metal micro-particles are disc-shaped in this example, they may have a spherical, convexo-plane or any other shape insofar as desired characteristics can be obtained. The shape generally relies on the process involved. On a GaAs substrate, for example, the shape of Au particles is convexo-plane. Though the metal micro-particles have a diameter of about 10 nm in this example, this is by no means limitative insofar as they are isolated. According to the fabrication method as described in the embodiments of the present invention, the shape, size and array of the metal micro-particles are controlled to make it possible to control the characteristics of the magneto-resistance materials.

The semiconductor substrate of the present invention preferably has an insulation or semi-insulation property. Instead, however, it may have a high resistance value corresponding to that of an insulation or semi-insulation substance. For example the high resistance value is at least 5 to 10 or more times higher, preferably 100 to 1,000 or more times higher, than that of a granular structure formed on the substrate in a high-resistance state.

The substrate of the magneto-resistance effect device according to the present invention is fabricated using a molecular beam epitaxy method. A GaAs(111)B substrate is first introduced into a vacuum chamber. Here, though the plane orientation of the GaAs substrate is (111)B, (111)A, (0001) or other plane orientation can be adopted insofar as metal micro-particles can be grown. The substrate is heated to around 400° C., with the degree of vacuum maintained to the order of $10^{-8}$ torr ($1.33 10^{-6}$ Pa), to dean the surface of the substrate. The substrate is then transported into a growth chamber without lowering the degree of vacuum to first grow a GaAs buffer layer on the substrate. The substrate temperature set at this time is 550 to 650° C., preferably 580 to 600° C. On the buffer layer Al or Au metal micro-particles are deposited. The substrate temperature set at this time is not more than 300° C., preferably not more than 250° C. in the case of Al or not more than 50° C. in the case of Au. The buffer layer is fabricated for the purpose of obtaining a desirable substrate surface and may be omitted from fabrication. After the deposition of the metal micro-particles, a Sb or GaAs cap layer is fabricated. The substrate temperature set at this time is not more than 300° C., preferably not more than 50° C. in the case of Sb or not more than 250° C. in the case of GaAs.

Figure 2:
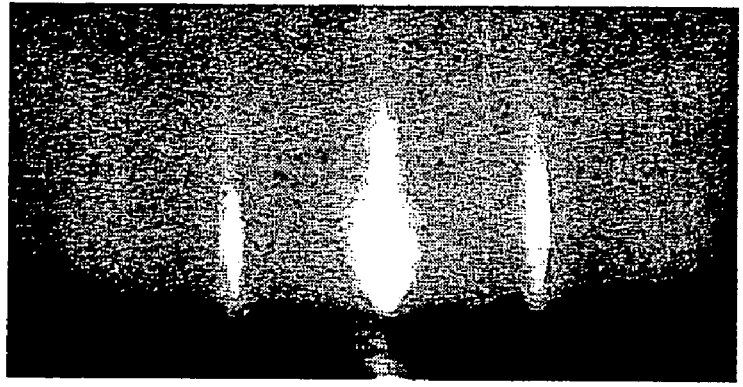
FIG. 2 is a diagram showing a diffracted image of the surface of a magneto-resistance effect device having Al metal micro-particles and a GaAs cap layer, observed through the reflection high-energy electron beam diffraction method.
Figure 2:
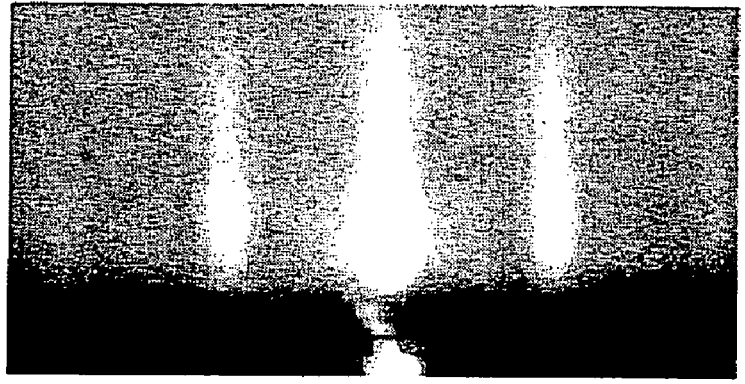
Figure 2:
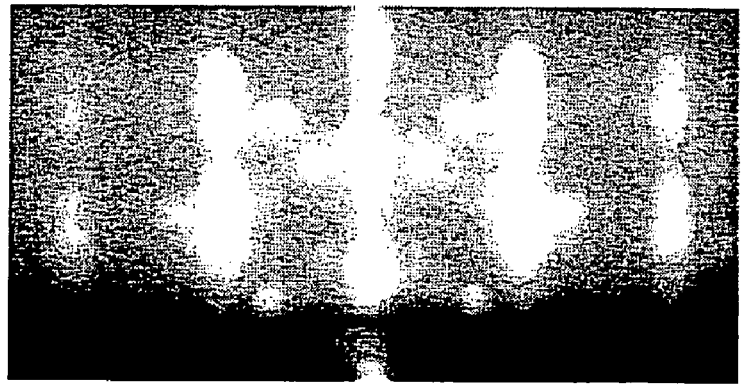

FIG. 2 is a diagram showing a diffracted image of the surface of a magneto-resistance effect device having Al metal micro-particles and a GaAs cap layer, observed through the reflection high-energy electron beam diffraction method. FIG. 2(a) shows an image viewed from the substrate surface after the formation of the GaAs buffer layer, FIG. 2(b) that after the deposition of the Al and FIG. 2(c) that after the formation of the GaAs cap layer. The streaks shown in FIG. 2(b) are wider than those shown in FIG. 2(a), which indicates the growth of the metal micro-particles. The image shown in FIG. 2(c) contains spots, which indicates that the cap layer has polycrystallinity including twin crystallinity.

Figure 3:
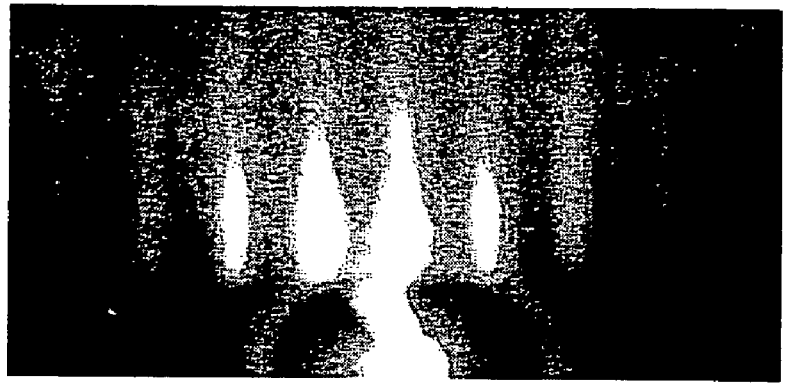
FIG. 3 is a diagram showing a diffracted image of the surface of a magneto-resistance effect device having Au metal micro-particles and a Sb cap layer, observed through the reflection high-energy electron beam diffraction method.
Figure 3:
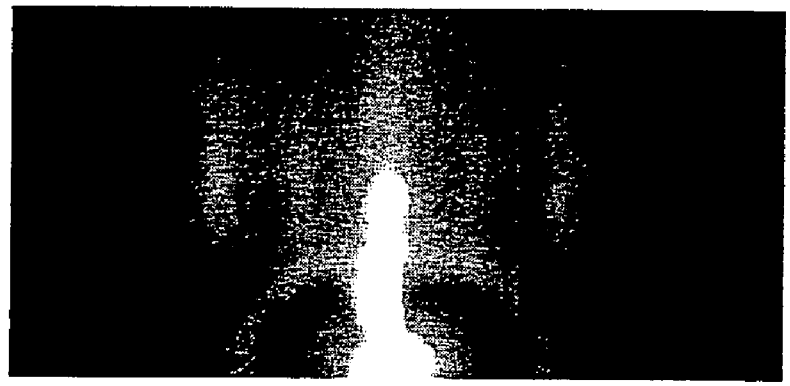
Figure 3:
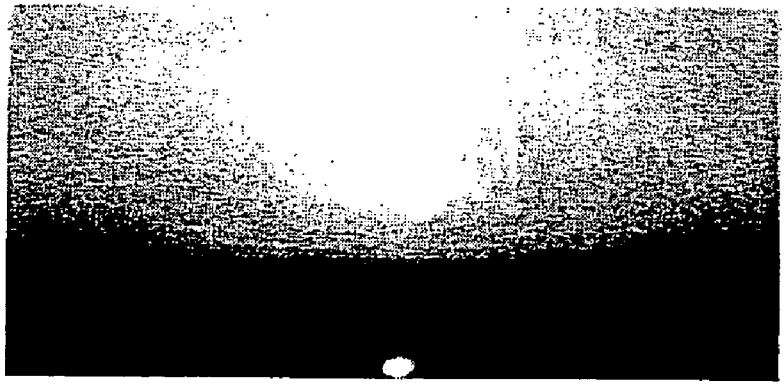

FIG. 3 is a diagram showing a diffracted image of the surface of a magneto-resistance effect device having Au metal micro-particles and a Sb cap layer, observed through the reflection high-energy electron beam diffraction method. FIG. 3(a) shows the image viewed from the substrate surface after the formation of the GaAs buffer layer, FIG. 3(b) that after the deposition of Au and FIG. 3(c) that after the formation of the Sb cap layer. The brightness of the streaks shown in FIG. 3(b) is lower than that of the steaks shown in FIG. 3(a), which indicates the growth of the metal micro-particles. The image shown in FIG. 3(c) has no diffraction image, which indicates that the cap layer is amorphous.

The amount of the metal micro-particles deposited is 0.2 to 0.5 nm in terms of the thickness of the metal micro-particles when flatly covering the substrate surface (nominal film thickness). The amount may fall outside the range insofar as the metal micro-particles do not completely adhere to each other on the substrate. The shape, size and array of the metal micro-particles can be adjusted depending on the fabrication method. This adjustment determines the characteristic parameters including the breakdown voltage at an electron avalanche phenomenon occurring in an embodiment that will be described herein below, the ratio of resistance values at ON and OFF times, etc. Therefore, it is important to vary the shape, size and array of the metal micro-particles so as to conform to the characteristics of a desired electronic device. On the vapor deposition rate, there is no particular limitation. However, it is desirable to set the rate to be 0.05 to 0.2 nm/sec so that the film thickness can be controlled. This vapor deposition control enables metal micro-particles having a suitable shape, size and array to be formed on the semiconductor substrate.

In the following embodiment, the substrate having the magneto-resistance effect device fabricated thereon is removed from the vacuum chamber and cleaved into strip-samples having a thickness of 2 to 4 mm and a length of 5 to 15 mm. Each sample is provided at its lengthwise opposite ends with an In electrode, and the characteristics of the resultant sample are evaluated using a 2-probe method. The material for the electrodes may be Au, Ag, Cu or other such material having good electrical conductivity. By varying the shape of the electrodes, it is possible to vary the degree and direction of voltage applied to the sample. Furthermore, use of photolithography used in an existing semiconductor fabrication process, such as electron beam lithography and photolithography, enables fabrication of a magneto-resistance effect device having an electrode width on the order of nm to μm. In this fabrication, it is necessary to further form an insulating layer having a suitable resistance value so as to avoid deterioration of the device characteristics and maintain electrical insulation from the electrodes. The degree of the breakdown voltage generated at the electron avalanche phenomenon that will be described herein below can be controlled through control of the electrode width and electrode shape. When the electrode shapes are the same, the threshold value (V-th) at which the breakdown voltage initiates has a relation of V-th=A/D with the distance D between the electrodes, where A stands for a proportional coefficient determined depending on the sample characteristics and electrode shapes.

Of existing magneto-resistance effect devices using a semiconductor alone, the semiconductor hetero-structure cited in the reference material at Nr. j of Table 1 exhibits the highest performance. While this semiconductor hetero-structure is a laminated layer comprising a plurality of different semiconductor layers, the fundamental structure of the magneto-resistance effect device according to the present invention is extremely simple and its fabrication process is also simple as described above. Furthermore, the magneto-resistance effect device of the present invention does not require use of an apparatus for fabricating the semiconductor hetero-structure, has a good compatibility with a semiconductor fabrication process and is higher in industrial value than conventional ones.

As embodiments of the magnetic field sensors using the magneto-resistance effect device, applications to a magnetic field sensor device, magnetic memory device, magnetic switching device, magnetism-control photodiode device, magnetism-control reference diode device and magnetism-control oscillator device will be described.

Figure 4:
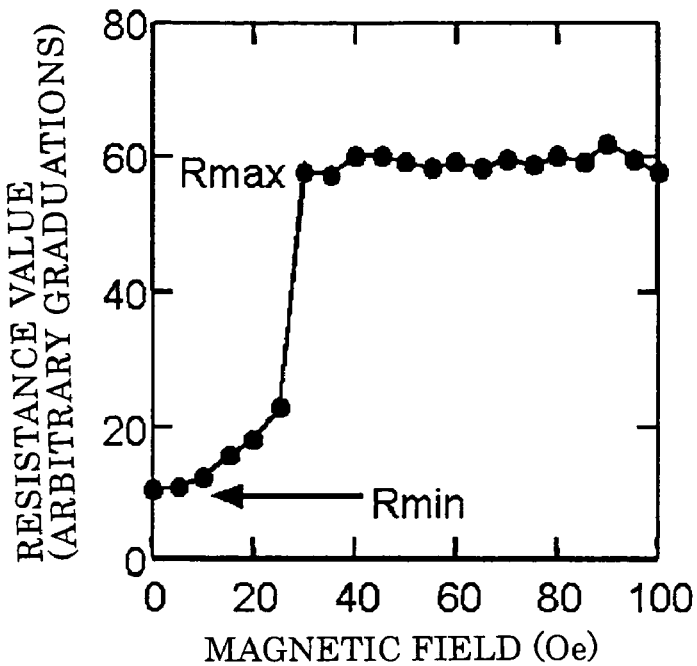
FIG. 4 is a graph showing one example of the results of measurement of a magneto-resistance device used as a magnetic field sensor device.

First, an embodiment in which the magneto-resistance effect device is applied to a magnetic field sensor device is shown in FIG. 14. One example of the results of measurement of the magneto-resistance effect device used as a magnetic field sensor device is shown in FIG. 4. The magneto-resistance effect device used here was fabricated by following the procedures mentioned earlier and comprised of a GaAs (111)B semiconductor substrate, a GaAs(111)B buffer layer having a thickness of 12 nm, Au metal micro-particles having a nominal film thickness of 0.2 nm and a Sb cap layer having a thickness of 5 nm. The magneto-resistance curve was obtained through the measurement made at room temperature using a 2-probe method. A magnetic field was applied in parallel to the sample surface and to the advancing direction of an electric current. When a magnetic field of 30 Oe was applied, the resistance value increased abruptly as shown in FIG. 4. The magneto-resistance ratio determined from a ratio of Rmax and Rmin reached the level of about 450%. This level indicates the performance higher by not less than one order than that of the highest-performance one of the existing devices operated by a magnetic field of not more than 100 Oe and shown in Table 1. This measurement was made at room temperature and therefore the aforementioned magneto-resistance effect device can readily be used as a magnetic field sensor device.

In FIG. 14, a standard resistor is used as a load of the magneto-resistance effect device, and constant voltage is applied to the series-connection circuit. However, a constant current may be applied to the magneto-resistance effect device, and a potential difference between the opposed ends of the device may be used as an output. Use of a constant current is desirable when the magneto-resistance effect device is used in a highly sensitive fashion.

Figure 5:
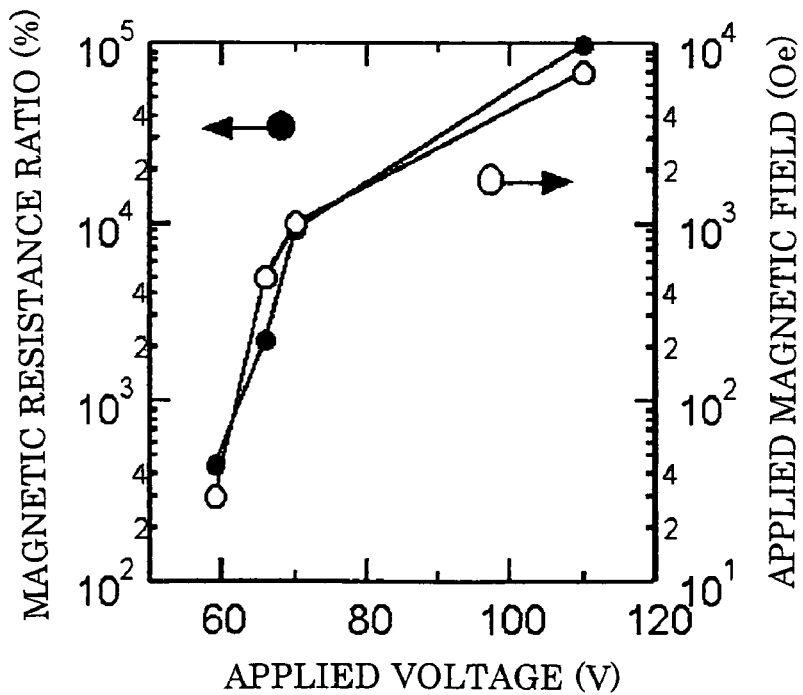
FIG. 5 is a graph showing the relationship between the applied voltage and the magneto-resistance ratio and between the applied voltage and the applied magnetic field of a magneto-resistance effect device.

In the measurement using the 2-probe method, by varying the voltage applied between the probes it is possible to dramatically vary the magnetic resistance ratio. The performance thereof is shown in FIG. 5. In the figure, solid circles represent magnetic resistance ratios, and it is shown that the resistance ratio increases from 450% to 100,999% with increasing voltage applied (the solid circles correspond Nr. o, Nr. p, Nr. q and Nr. r, respectively). As shown by blank circles, however, the value of the magnetic field necessary to induce the magneto-resistance effect also increases with increasing voltage applied When designing a magnetic field sensor device, therefore, it becomes necessary to vary the value of the voltage to be applied in accordance with the value of a magnetic field detected.

In other words, the present invention provides a magnetic field sensor device that enables a magnetic resistance ratio and magnetic field sensitivity to be varied by variation of voltage applied. This is a function conventional devices do not have.

Since the voltage to be applied relies on the distance between the device electrodes, when designing a magnetic field sensor device, the aforementioned relationship V-th=A/D is used to select a value of the applied voltage suitable for an electronic circuit the magnetic field sensor device is intended to connect to.

Figure 15:
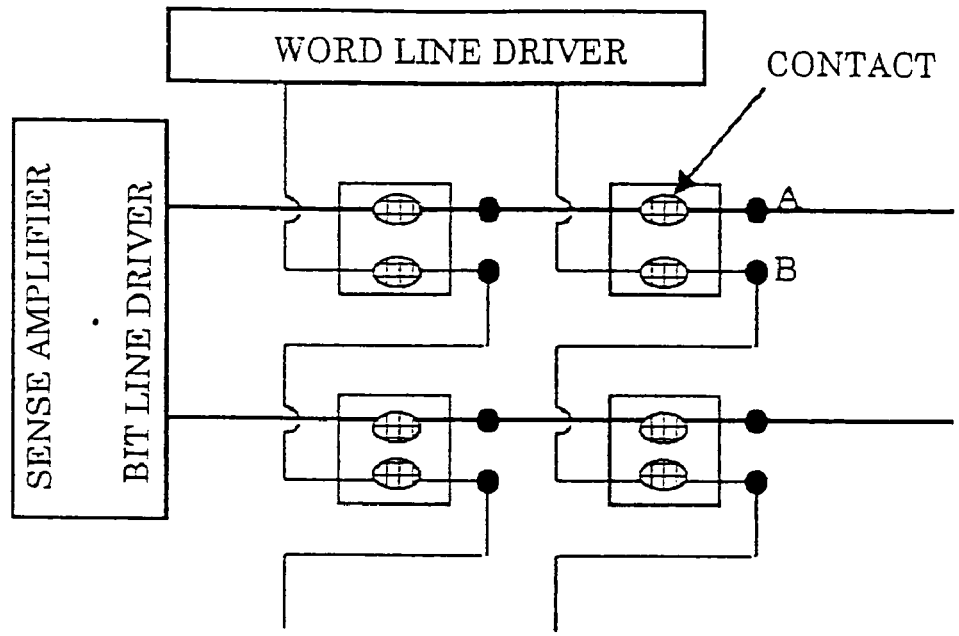
FIG. 15(a) is a block diagram showing one embodiment of a magneto-resistance effect device used as a magnetic memory device.
FIG. 15(b) is a chart showing the movement timing.
Figure 15:
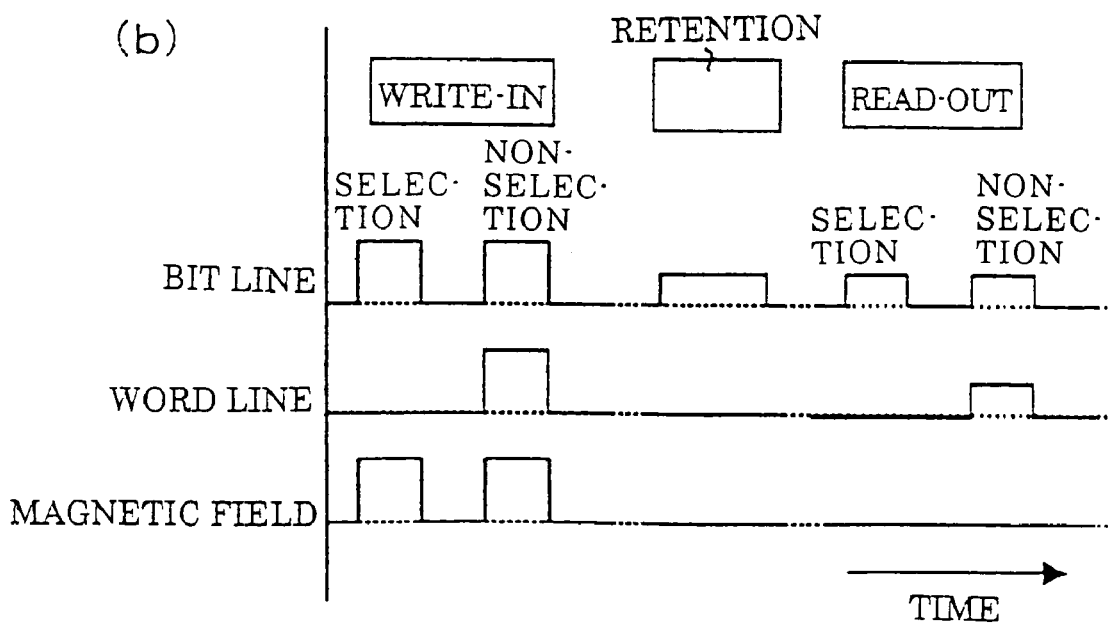

An embodiment in which the magneto-resistance effect device is used as a magnetic memory device is shown in FIG. 15(a). FIG. 15(a) shows a four-cell array. Between points A and B in the figure, a diode for cell selection can be inserted.

Figure 6:
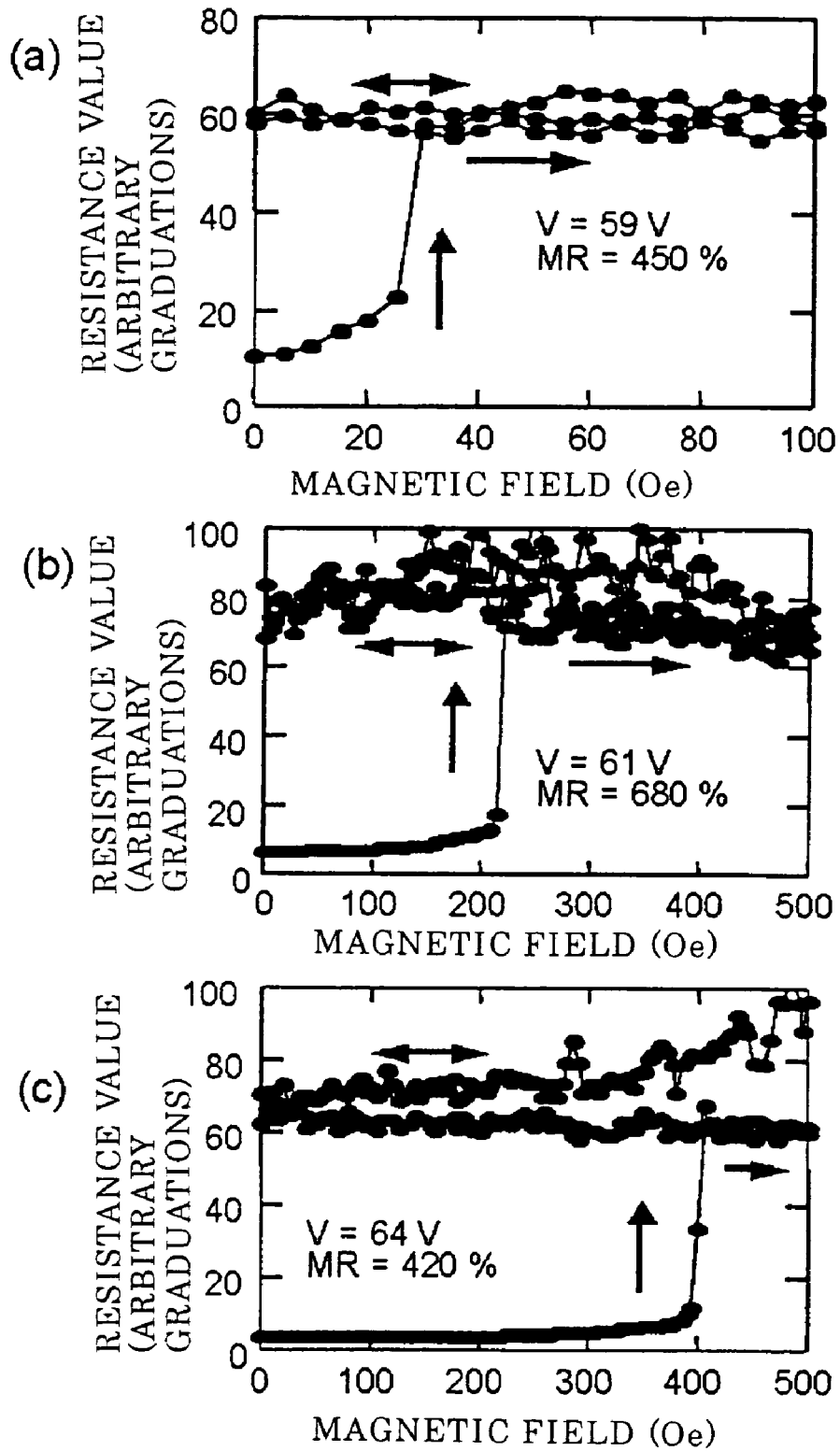
FIG. 6 is a graph showing one example of the magnetic field-resistance value results of measurement of a magneto-resistance effect device used as a magnetic memory device.

One example of the results of measurement of the magneto-resistance effect device used as a magnetic memory device is shown in FIG. 6. The magneto-resistance effect device was fabricated by following the procedures mentioned earlier and comprised of a GaAs(111)B semiconductor substrate, a GaAs(111)B buffer layer having a thickness of 12 nm, Au metal micro-particles having a nominal film thickness of 0.2 nm and a Sb cap layer having a thickness of 5 nm. The magneto-resistance curve was obtained through the measurement made at room temperature using a 2-probe method. A magnetic field was applied in parallel to the sample surface and to the advancing direction of an electric current. The curves obtained through variation of the voltage applied between the two terminals used as the electrodes to 59V, 61V and 64V are shown in FIG. 6(a), FIG. 6(b) and FIG. 6(c), respectively. The arrows shown in each figure indicate a magnetic field-sweeping direction.

In FIG. 6(b), for example, it is understood that the initial resistance value of 5 (arbitrary unit) increases about 70 by application of a magnetic field of 220 Oe or more and that the increased value is thereafter maintained even when the magnetic field is increased or decreased. In any one of the figures, the magnetic resistance ratio is not less than 400%, and application of a magnetic field of a constant (threshold) value induces a non-reversible change from a low resistance value to a high resistance value.

The high-resistance value state can be returned to the low-resistance value state by decreasing the applied voltage to a certain threshold value or less and setting the applied voltage (V) at the value shown in the figures. In other words, the present invention provides a memory device reciprocating a high resistance value (1) and a low resistance value (0) by the use of a magnetic field and an electric field.

A timing diagram when performing writing into each cell of the configuration shown in FIG. 15(a) is shown in FIG. 15(b). As shown in this figure, in the case of the selected cell, the bit line connected is set at a high ($H_w$) level and the word line connected is set at a low (L) level. As regards the non-selected cell, the bit line and word line are set at $H_w$ and $H_w$ levels or at L and L levels, respectively. In this case, a magnetic field is applied to both cells.

Writing into the cells can be performed by setting in advance the bit line and word line of each cell are set at $H_w$ and L levels, respectively, and raising only the intensity of the magnetic field in a selected cell.

Memory reading-out can be attained by setting the bit line at L level, setting the selected word line at a low $H_R$ level lower than $H_w$ level, setting the non-selected word line at an intermediate (M) level lower than the $H_R$ level and using a sense amplifier connected to the bit line to discriminate an electric current flowing during this course. Why the selected word line is set at the low $H_R$ level lower than the $H_w$ level and the non-selected word line is set at the intermediate (M) level is so that memory contents are not rewritten even through reading-out.

In order to retaining the memory state during the course of not performing rewriting or reading-out, the bit line and word line are set at the M and L levels, respectively.

Since data are eliminated when voltage is deprived of, the memory arrays are eliminated when setting the word line and bit line at the H and H levels or the L and L levels, respectively.

From one aspect, the present invention provides a magnetic memory device capable of writing-in using a magnetic field, electrically reading out the resistance value to detect signals 1 and 0 and being refreshed using an electric field. From another aspect, the present invention provides a magnetic memory device capable of eliminating the date through application of a magnetic field while electrically reading out the resistance value to detect the signals 1 and 0. This memory device can retain data having high security, such as personal data, and eliminate the data when performing unexpected reading-out.

From still another aspect, this memory device can be called a memory device capable of controlling the magnetic field sensitivity used for reading-out and elimination with voltage.

Figure 7:
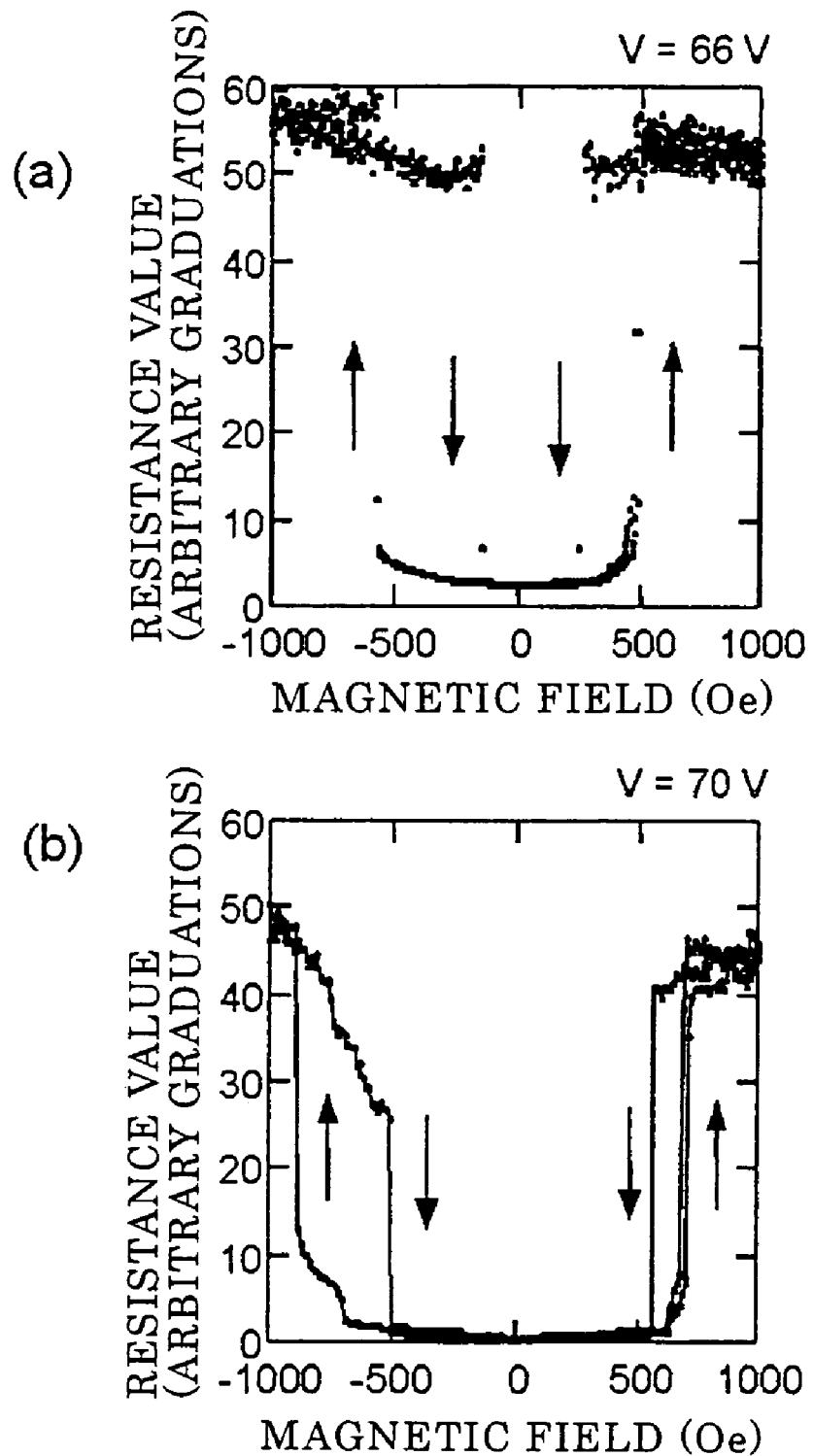
FIG. 7 is a graph showing one example of the magnetic field-resistance value results of measurement of a magneto-resistance effect device set to have a hysteresis.

In FIG. 7, the curves obtained when the voltage applied between the two terminals was changed to 66 V and to 70 V are shown in FIG. 7(a) and FIG. 7(b), respectively. In the figures, the arrows indicate a magnetic field-sweeping direction. Hysteresis of several hundred Oe exists in a magnetic field of not more than 500 Oe at 66 V and in a magnetic field of not more than 500 Oe at 70 V. In FIG. 7(a), for example, two resistance values of about 3 and about 50 different by one order or more from each other are shown. When the two values are defined as memory actions 1 and 0, respectively, the magneto-resistance material functions as a magnetic memory device driven by an external magnetic field. In this magnetic memory device, since its hysteresis is sufficiently large and memory variation is large, it is possible to realize a stable memory operation driven by a magnetic field. From yet another aspect the present invention provides a memory device storing a variation in external magnetic field.

Figure 16:
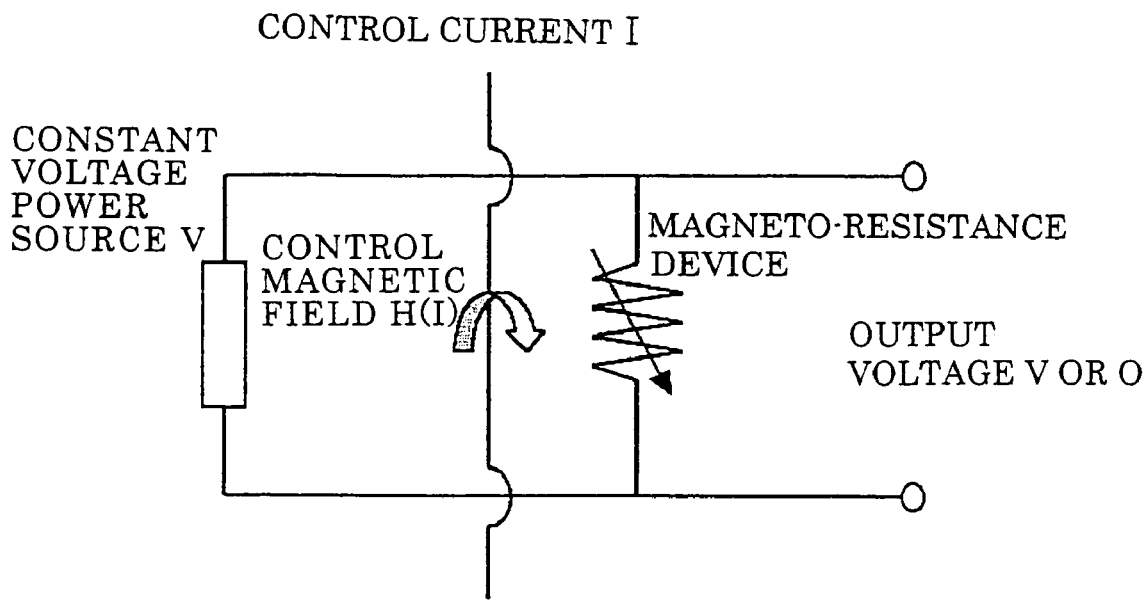
FIG. 16 is a circuitry showing one embodiment of a magneto-resistance effect device used as a magnetic switching device.

An embodiment in which the magneto-resistance effect device is used as a magnetic switching device is shown in FIG. 16. FIG. 16 shows a type generating a control magnetic field by the application of a control electric current. It is desirable to dispose electric wiring to which an electric current flows as dose as possible to the device so that the magnetic field generated by the application of the electric current can magnetism-control the device. In order to also reduce power consumption, the distance between the device and the wiring is desirably made small.

Figure 8:
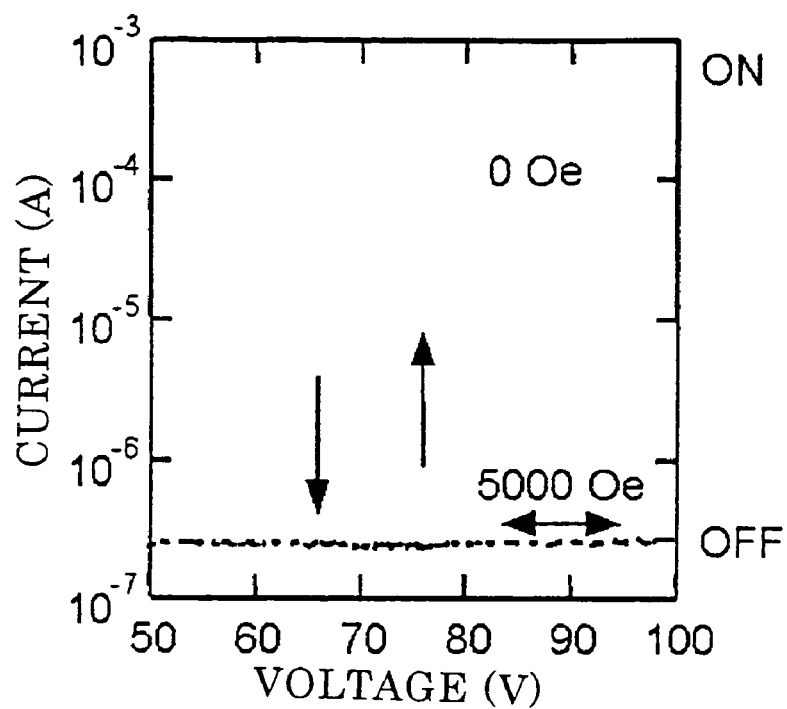
FIG. 8 is a graph showing one example of the voltage-current results of measurement of a magneto-resistance effect device used as a magnetic switching device.

The magnetic switching device is fabricated by following the procedures mentioned earlier and comprised of a GaAs (111)B semiconductor substrate, a GaAs(111)B buffer layer having a thickness of 12 nm, Au metal micro-particles having a nominal film thickness of 0.2 nm and a Sb cap layer having a thickness of 5 nm. The current-voltage characteristics are shown in FIG. 8. The current-voltage curves were obtained by measurement at room temperature using the 2-probe method. The magnetic field was applied in parallel to the sample surface and to the advancing direction of the current. The arrows shown in FIG. 8 indicate a voltage-sweeping direction.

In the magnetic field of 0 Oe, the current-voltage characteristics are such that when elevating the voltage the current is abruptly elevated at about 80 V as shown by the solid line in FIG. 8. This transition is very sharp and is a switching phenomenon from a low-current state to a high-current state. The switching width reaches $3 \times 10^3$ when applying voltage of 100 V. This switching phenomenon results from the electron avalanche phenomenon occurring at the threshold voltage. The switching phenomenon disappears when a magnetic field has been applied.

In other words, the present invention provides a magnetic switching device using a switching phenomenon between two states, one being a high-current state set by the application of voltage and the other being a low-current state brought about by the application of a magnetic field.

On the other hand, the present invention provides a switching device in which a control circuit and a switching circuit are magnetically connected to and electrically separated from each other. The structure of existing semiconductor memories adopts an insulating method by an electronic device, such as a semiconductor diode, a transistor, etc. The switching device of the present invention is simple in structure and exhibits a high insulation effect, compared with the conventional devices.

Figure 17:
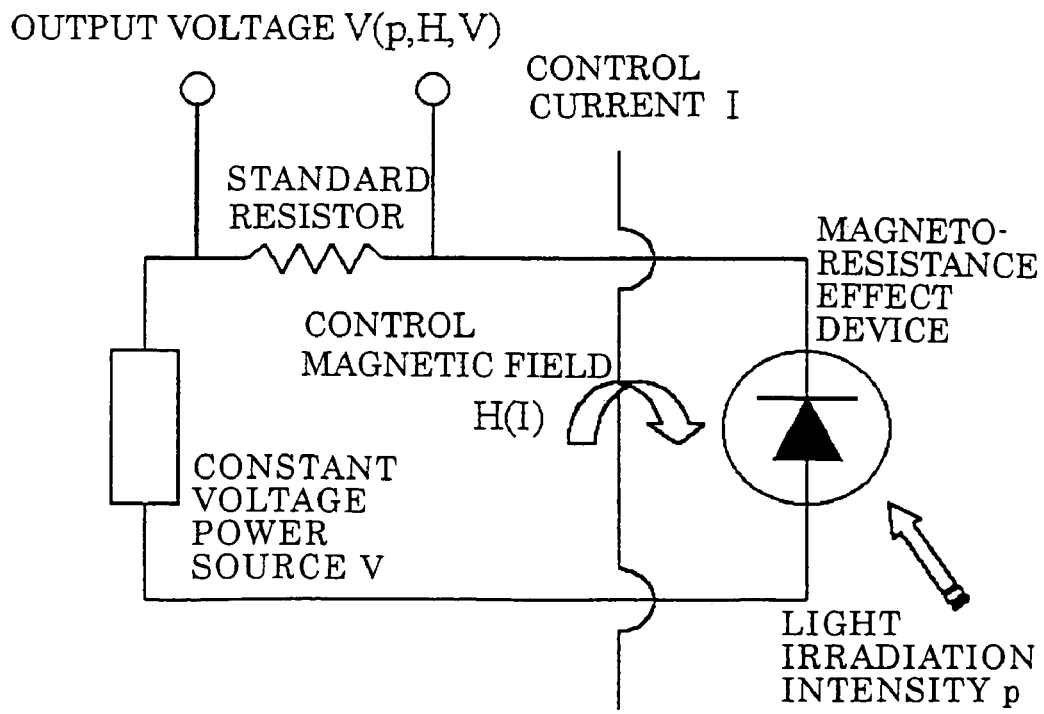
FIG. 17 is a circuitry showing one embodiment of a magneto-resistance effect device used as a magnetism-control photodiode device.
Figure 18:
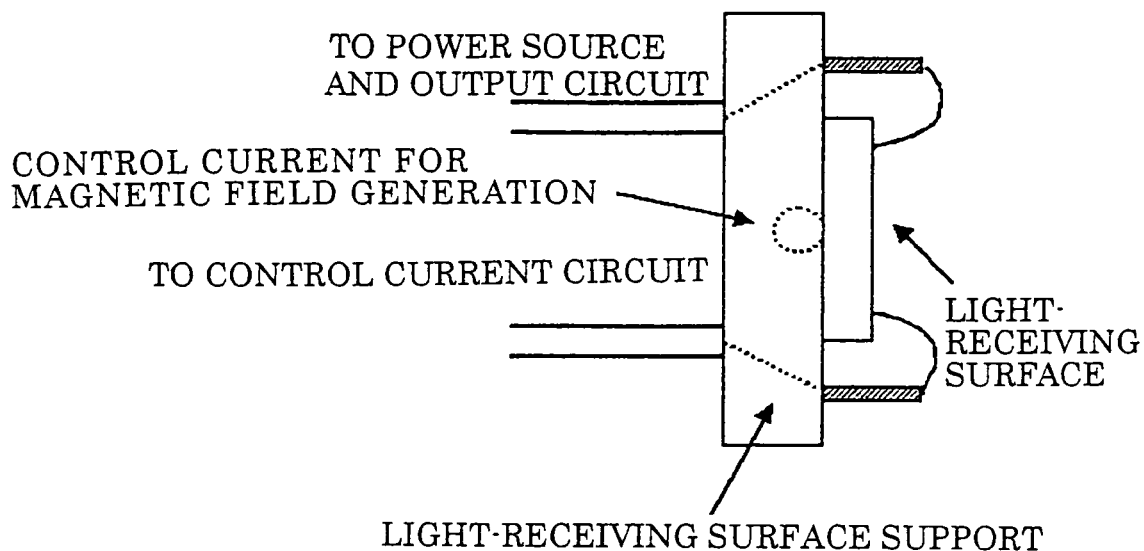
FIG. 18 is a schematic view showing one embodiment in which a magnetism-control photodiode device is packed in a package.
Figure 18:
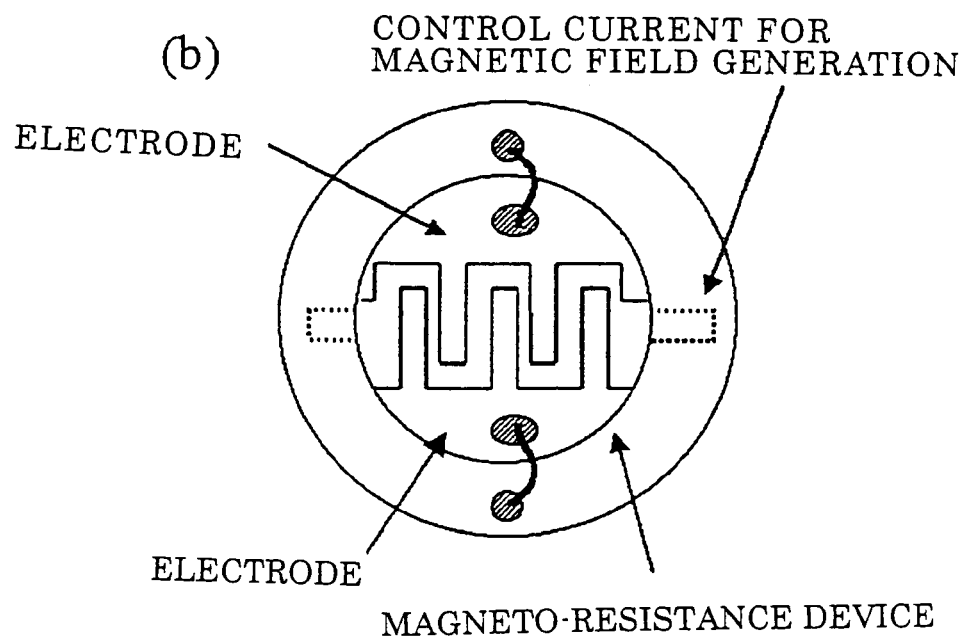

An embodiment in which the magneto-resistance effect device is used as a magnetism-control photodiode device is shown in FIG. 17. FIG. 17 shows a type capable of varying its characteristics using a control magnetic field. FIG. 18 shows a type to be stored in a package. In FIG. 18, light is input to a substrate surface provided with an electrode pattern, and a control magnetic flux is generated in parallel to the sample surface. It is desirable that the length of the electrodes sandwiching the magneto-resistance device (thin film) be set to be as long as possible and that a control current for generating a magnetic field be disposed at the back surface of the magneto-resistance device so as not to interrupt the light-receiving surface.

The magneto-resistance effect device is fabricated by following the procedures mentioned earlier and comprised of a GaAs(111)B semiconductor substrate, a GaAs(111)B buffer layer having a thickness of 12 nm, Au metal micro-particles having a nominal film thickness of 0.2 nm and a Sb cap layer having a thickness of 5 nm. The current-voltage characteristics were measured at room temperature using the 2-probe method. The magnetic field was applied in parallel to the sample surface and to the advancing direction of the current to measure magnetic-field dependency. The beams of a red semiconductor laser diode having a wavelength of 636 nm as one example were used for light irradiation. The laser beams of 2 mW were irradiated orthogonal to the sample surface.

Figure 9:
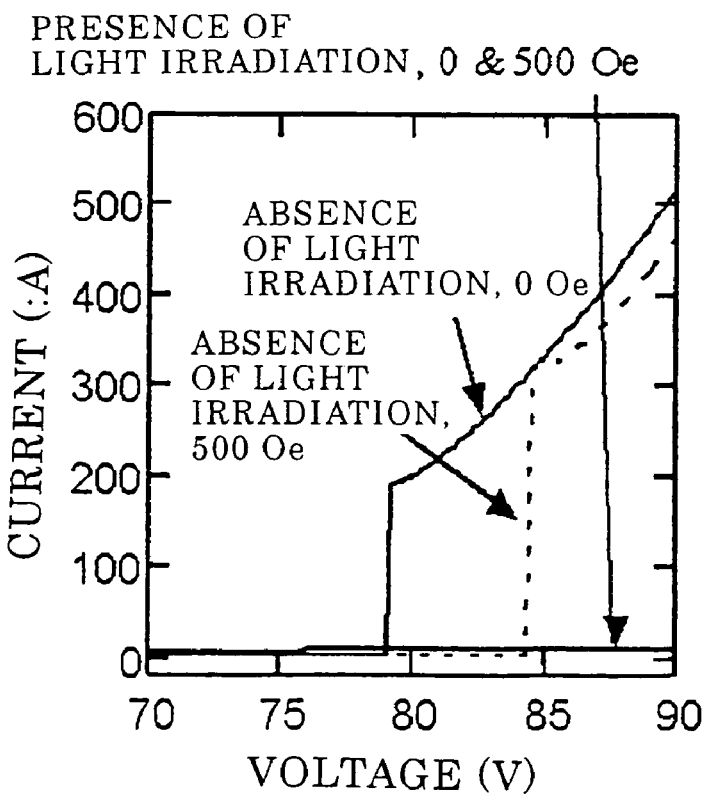
FIG. 9 is a graph showing one example of the voltage-current results of measurement of a magneto-resistance effect device in the presence of light irradiation.

FIG. 9 shows light irradiation and magnetic-field dependency of the current-voltage characteristics. Using this figure, the operation of the magnetism-control photodiode device will be described. First, the voltage between the two terminals of the electrodes is set to be 80 to 84 V. As a result, a current of approximately 200 μA flows in a magnetic field of 0 Oe. The current value falls down to substantially 0 when light irradiation has been conducted. Reading out the difference between the current values enables optical signals to be read out. The feature of this device lies in that this operation can be stopped by application of a magnetic field. When a magnetic field of 500 Oe is applied, for example, the threshold voltage becomes 84 V or more. This makes the current value that varies with or without light irradiation extremely small, as is clear from FIG. 9.

In other words, the present invention provides a high-performance photodiode device capable of making on-operation and off-operation by application of a magnetic field.

Since the breakdown voltage of the electron avalanche determines the operation voltage, the operation voltage can be varied with ease as described above through variation of the distance between the electrodes in accordance with the relationship V-th=A/D.

In the present embodiment, the wavelength of the light used for irradiation was 636 nm. However, other wavelengths can be adopted insofar as they fall in the region of wavelengths shorter than the wavelength corresponding to the energy band gap of the semiconductor constituting the magneto-resistance effect device. In other words, the wavelength characteristic of the photodiode device of the present invention can optionally be varied through variation of the energy band gap of the semiconductor used. For example, variation of a mixing ratio of Group III elements enables the energy band gap of the semiconductor to be varied. This method has already been well known in the field of semiconductor laser diodes and photodiodes.

In existing semiconductor photodiode devices, light irradiation makes the current value large (positive). In the magneto-resistance effect device of the present invention, however, strong and weak codes of signals to light are inverted That is to say, it is a feature of the present device that light irradiation makes the current value small (negative). This is due to the effect of making an electron avalanche phenomenon effect difficult to manifest in the magneto-resistance effect device of the present invention, which effect is brought about by electrons from the light irradiated.

The wavelength of light is made consistent with the wavelength corresponding to the energy band gap of the semiconductor constituting the magneto-resistance effect device, and irradiation power of light is adjusted This enables the length of light invasion to be substantially the same as the distance between the sample surface and the existing position of the metal micro-particles. As a result, the strong and weak codes of the signals can be varied. This is another feature of the present invention. In the region in which the metal micro-particles exist, the electrons from the light induce the electron avalanche effect. Therefore, an electron circuit in which the magnetism-control photodiode device of the present invention is to be incorporated determines whether the strong and weak codes of signals are set to be positive or negative.

Figure 19:
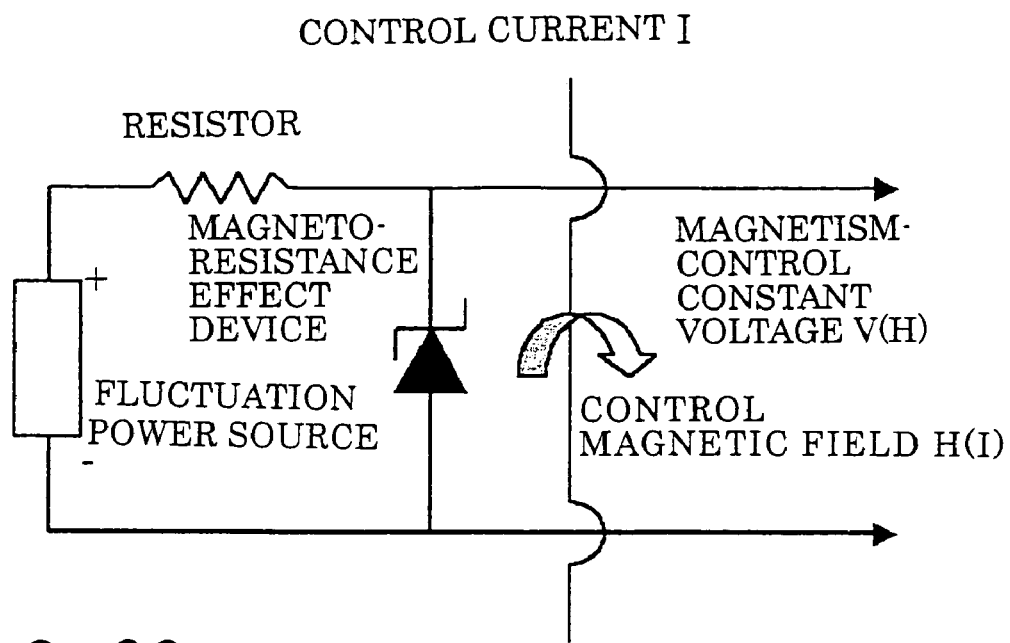
FIG. 19 is a circuitry showing one embodiment of a magneto-resistance effect device used as a magnetism-control reference diode device.

An embodiment in which the magneto-resistance effect device is used as a magnetism-control reference photodiode device is shown in FIG. 19. FIG. 19 shows a type capable of varying voltage setting using a control magnetic field. Electric wiring through which a control current flows, is disposed at a position at which a magnetic field generated by the control current can magnetism-control the diode. In order to reduce power consumption, it is desirable that the distance between the diode and the wiring be made small.

As is well known, a reference diode indicates diodes with the aim of maintaining the voltage constant. Existing reference diodes have the principle of avalanche breakdown or Zener breakdown of a PN junction and are used for a circuit requiring the voltage to be not more than their peculiar threshold voltage. The present invention provides a magnetism-control reference diode device capable of varying the threshold voltage using a control magnetic field.

Figure 10:
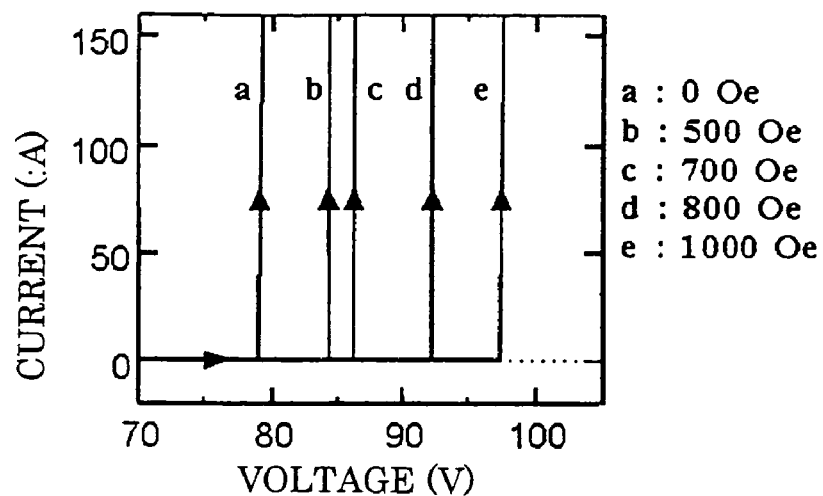
FIG. 10 is a graph showing one example of the voltage-current results of measurement of a magneto-resistance effect device used as a magnetism-control reference diode device.

The magneto-resistance effect device used for the magnetism-control reference diode device is fabricated by following the procedures mentioned earlier and comprised of a GaAs(111)B semiconductor substrate, a GaAs(111)B buffer layer having a thickness of 12 nm, Au metal micro-particles having a nominal film thickness of 0.2 nm and a Sb cap layer having a thickness of 5 nm. One example of the current-voltage characteristics is shown in FIG. 10. The measurement thereof was performed at room temperature using the 2-probe method The magnetic field was applied in parallel to the sample surface and to the advancing direction of the current. The arrows in the figure indicate a voltage-sweeping direction.

It is understood from FIG. 10 that the threshold voltage varies by the application of a magnetic field. First, in the current-voltage characteristics in a magnetic field of 0 Oe, abrupt current increment is shown at about 80 V. In other words, this shows a reference diode characteristic that voltage of more than 80 V cannot be applied In other words, this shows so-called Zener diode characteristics in which voltage more than 80 to 100 V with increasing the magnetic field; here, the applied magnetic field to control the threshold voltage is at most 1,000 Oe and the magnetic field is small enough to design the realistic magnetic device. That is to say, the present invention provides a magnetism-control reference diode device capable of varying the reference diode characteristics by application of a magnetic field.

Figure 20:
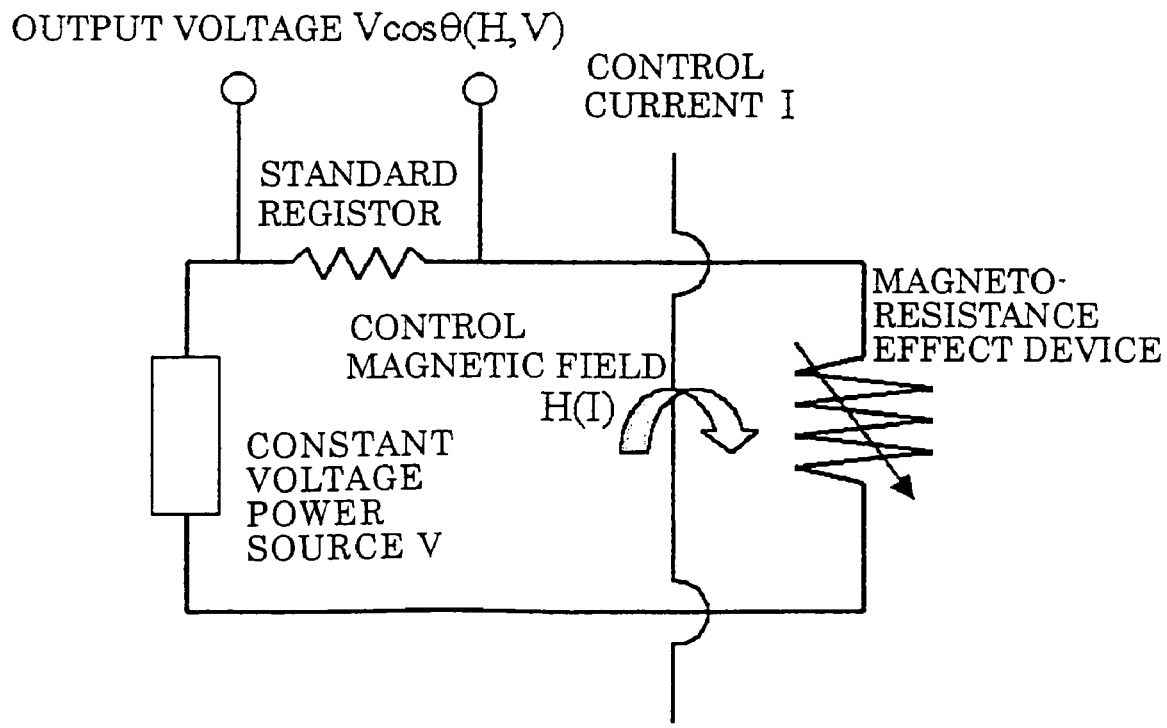
FIG. 20 is a circuitry showing one embodiment of a magneto-resistance effect device used as a magnetism-control oscillator device.

An embodiment in which the magneto-resistance effect device is used as a magnetism-control oscillator device is shown in FIG. 20. FIG. 20 shows a type capable of controlling the oscillation frequency using a control magnetic field. This embodiment is similar to that of the magnetic switching device as described above. Electric wiring through which a control current flows, is disposed at a position at which a magnetic field generated by the control current can magnetism-control the oscillator device. In order to reduce power consumption, it is desirable that the distance between the diode and the wiring be made small.

Diodes for an oscillator device include IMPATT diodes using the electron avalanche effect and Gunn diodes using the Gunn effect and use an oscillation phenomenon in a semiconductor device using high voltage. The present invention provides a magnetism-control oscillator device capable of varying the oscillation wavelength through control of the applied voltage and applied magnetic field even in one device by application of a magnetic field.

The magnetism-control the oscillator device is the magneto-resistance effect device fabricated by following the procedures mentioned earlier and comprises a GaAs(111)B semiconductor substrate, a GaAs(111)B buffer layer having a thickness of 4 nm, Al metal micro-particles having a nominal film thickness of 0.5 nm and a GaAs cap layer having a thickness of 20 nm. The measurement of the magnetism-control oscillator device and of the current time characteristics was performed at room temperature using the 2-probe method. The magnetic field was applied in parallel to the sample surface and to the advancing direction of the current.

Figure 11:
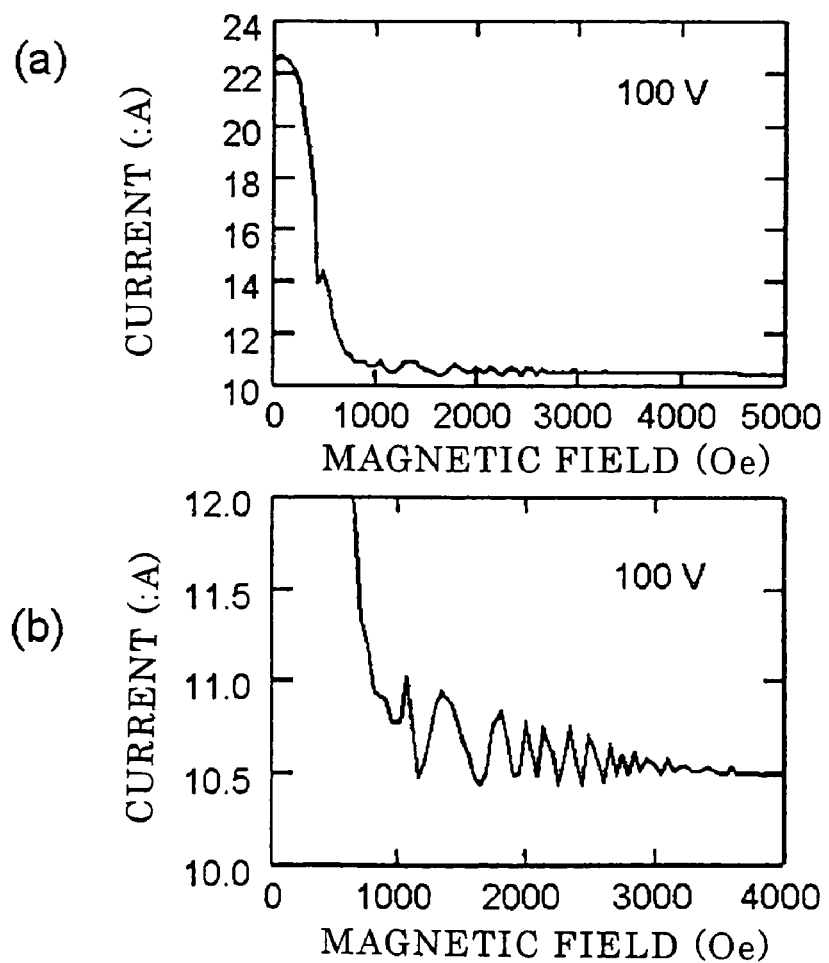
FIG. 11 is a graph showing one example of the magnetic field-current results of measurement of a magneto-resistance effect device used as a magnetism-control oscillator device.

FIG. 11(a) shows the results of measurement of the current-magnetic field characteristics. The constant voltage between the two-terminal electrodes was set to be 100 V. Application of a magnetic field resulted in abrupt current value decrement. What attention is to be paid to was generation of oscillation to the magnetic field after being switched to a low current value. FIG. 11(b) shows enlargement of the oscillation. There has been no report on this phenomenon, which has been reported here for the first time. This is an oscillation phenomenon due to rivalry between the action of the magnetic field to freeze the electron avalanche phenomenon and the action of the electric field to promote the electron avalanche phenomenon.

Figure 12:
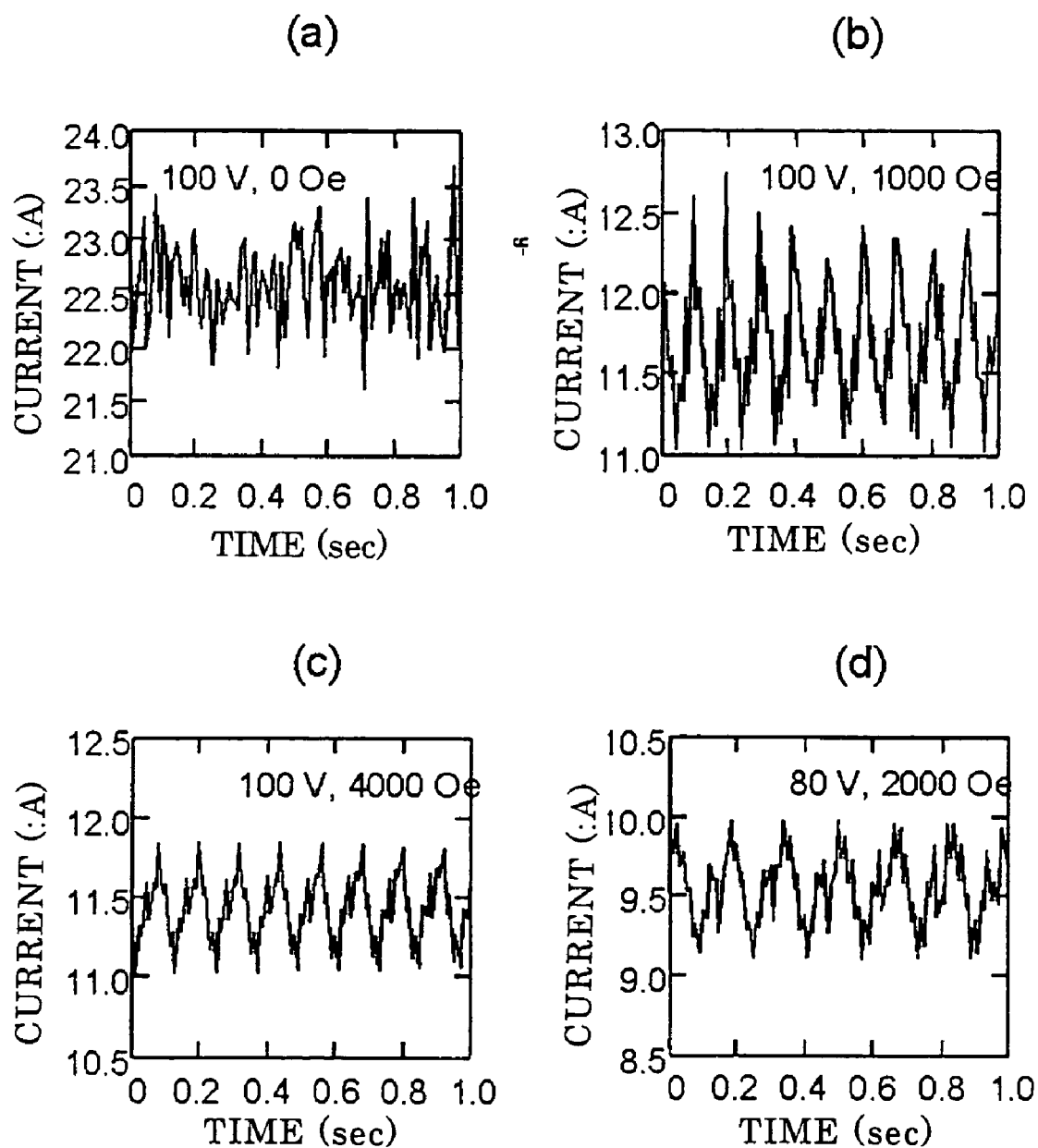
FIG. 12 is a graph showing the variation of the current with the lapse of time in a magneto-resistance effect device used as a magnetism-control oscillator device.

As regards the oscillation phenomenon, FIG. 12 shows the time-course change of an electric current when an electric field and a magnetic field are given variations. FIG. 12(a) shows the case where voltage of 100 V was applied in the absence of a magnetic field, in which no oscillation phenomenon occurred in the current value. FIG. 12(b) shows the case where a magnetic field of 1,000 Os was applied in the state of application of voltage of 100 V, in which the oscillation phenomenon occurred. FIG. 12(c) shows the case where the applied magnetic field was elevated to 4,000 Oe, with the voltage maintained at 100 V, in which the oscillation frequency became small. FIG. 12(d) shows the case where a magnetic field of 2,000 Oe was applied in the state of application of voltage of 80 V, in which further delayed oscillation was observed.

Thus, FIG. 12 shows that the oscillation frequency varies with control of the values of the voltage (i.e. electric field) and magnetic field. In other words, the present invention provides a high-performance magnetism-control oscillator device capable of varying the oscillation wavelength with control of the applied voltage and magnetic field.

In this embodiment, the oscillation frequency was varied in the range of 6 to 10 Hz. However, it has been well known to those skilled in the art that the frequency can freely be changed through changes of the shape of the electrodes and the distance between the electrodes. Generally, the oscillation frequency is elevated when the distance between the electrodes is made short. In the magnetic switching device of the present invention, the drive voltage is changed through changes of the shape, size and array of the metal micro-particles. Therefore, it is clear that the oscillation manner through the change of the drive voltage. From another aspect, it can be said that the magnetic switching device of the present invention has a high potential as a magnetism-control oscillator device.

While various embodiments have been described above, the present invention is not limited to these embodiments. It can readily be understood that the same effects as the present invention can be obtained through changes of the semiconductor substrate materials and metal micro-particle materials, or change of the materials constituting the cap layer.

INDUSTRIAL APPLICABILITY

As has been described in the foregoing, the magneto-resistance effect device of the present invention utilizes sensitiveness to a magnetic field to provide a variety of functions conventional devices do not have. Its fabrication process is readily performed, is well compatible with existing semiconductor film fabrication processes and is an industrially useful technique. Since the present invention provides the aforementioned configuration, the following effects can be manifested.

That is to say, the present invention makes it possible to realize a magneto-resistance effect device having high sensitiveness to a magnetic field and its fabrication process is easy to match conventional semiconductor fabrication processes in spite of its simple fundamental configuration having a plurality of metal micro-particles dispersed on a semiconductor substrate.

When using the magneto-resistance effect device to configure a magnetic field sensor device, its magnetic resistance ratio and magnetic field sensitiveness can be changed through variation of the applied voltage.

When using the magneto-resistance effect device to configure a magnetic memory device, the memory operation stable in magnetic field drive can be attained.

When using the magneto-resistance effect device to configure a magnetic switching device, the effects that its structure is simple structure and that an insulation property is high can be obtained.

When using the magneto-resistance effect device to configure a magnetism-control photodiode device, its on-operation and off-operation can be performed through application of a magnetic field.

When using the magneto-resistance effect device to configure a magnetic reference voltage diode device, its threshold voltage can be changed using a control magnetic field.

When using the magneto-resistance effect device to configure a magnetism-control oscillator device, its oscillation wavelength can be changed through control of the applied magnetic voltage and applied magnetic field.

The invention claimed is:

1. A magneto-resistance effect device, comprising:
   a semiconductor region having a surface having a plurality of non-magnetic metal particles of a size equal to or smaller than 100 μm, the metal particles being formed of gold or aluminum and isolated from one another at intervals equal to or smaller than 1 μm;
   a cap layer which is formed of either antimony or gallium arsenide, and said cap layer is covering the semiconductor region and the non-magnetic metal particles so as to directly contact and embed the plurality of the non-magnetic metal particles, and said cap layer and said non-magnetic metal particles comprise a granular structure and said cap layer has a smooth top surface, wherein the antimony or gallium arsenide exists across an entire thickness of the cap layer from the semiconductor region to an opposite surface of the cap layer; and
   a plurality of electrodes provided on a surface of the cap layer and separated from one another.

2. The magneto-resistance effect device according to claim 1, wherein the semiconductor region is formed of a III-V Group semiconductor.

3. A magnetic field sensor using the magneto-resistance effect device according to claim 1, comprising:
   a constitution that causes a change in intensity of a magnetic field in the surface of the semiconductor region between the electrodes; and
   a constitution that senses a variation in electric resistance between the electrodes.

4. The magnetic field sensor according to claim 3, further comprising a constitution that adjusts voltage between the electrodes or adjusts a bias magnetic field for adjusting intensity of the magnetic field in the surface of the semiconductor region to increase the variation in electric resistance between the electrodes resulting from the change of the magnetic field intensity.

5. The magnetic field sensor according to claim 3, further comprising a constitution that adjusts voltage between the electrodes or adjusts a bias magnetic field for adjusting intensity of the magnetic field in the surface of the semiconductor region to operate the magnetic field sensor in a region in which an electron avalanche phenomenon occurs between the electrodes.

6. The magnetic field sensor according to claim 3, further comprising a constitution that adjusts voltage between the electrodes or adjusts a bias magnetic field for adjusting intensity of the magnetic field in the surface of the semiconductor region enabling the variation in electric resistance between the electrodes resulting from the change in magnetic field intensity to operate the magnetic field sensor in a region having hysteresis characteristics.

7. The magnetic field sensor according to claim 3, further comprising a constitution that changes intensity of light irradiated on the surface of the semiconductor region between the electrodes.

8. The magnetic field sensor according to claim 7, further comprising a constitution that adjusts voltage between the electrodes, adjusts a bias magnetic field for adjusting the magnetic field intensity in the surface of the semiconductor region or adjusts the intensity of the irradiated light to increase the variation in electric resistance between the electrodes resulting from the change of the magnetic field intensity or from the change of the light intensity.

9. The magnetic field sensor according to claim 7, further comprising a constitution that adjusts voltage between the electrodes, adjusts a bias magnetic field for adjusting the magnetic field intensity in the surface of the semiconductor region or adjusts the intensity of the irradiated light to enable the variation in electric resistance between the electrodes resulting from the change of the magnetic field intensity or from the change of the light intensity to operate the magnetic field sensor in a region having hysteresis characteristics.

10. The magnetic field sensor according to claim 7, further comprising a constitution that adjusts voltage between the electrodes, adjusts a bias magnetic field for adjusting the magnetic field intensity in the surface of the semiconductor region or adjusts the intensity of the irradiated light to operate the magnetic field sensor in a region in which an electron avalanche phenomenon occurs between the electrodes.

11. A magnetic field sensor using the magneto-resistance effect device according to claim 1 comprising:
    a constitution that exerts a magnetic field onto the surface of the semiconductor region between the electrodes;
    a constitution that applies voltage between the electrodes; and
    a constitution that extracts an output including a vibration component from an electric current flowing between the electrodes.

12. The magneto-resistance effect device according to claim 1, wherein the cap layer has a thickness of 1 nm to 100 nm.

13. The magneto-resistance effect device according to claim 1 or 12, wherein the non-magnetic metal particles have a diameter of 1 nm to 100 nm and are dispersed at intervals of 1 nm to 100 nm.

14. The magneto-resistance effect device according to claim 1 or 12, wherein the cap layer is polycrystalline.

15. The magneto-resistance effect device according to claim 1 or 14, wherein the cap layer is amorphous.

16. The magneto-resistance effect device according to claim 1 or 12, wherein the electrodes are formed on a plurality of ferromagnetic particles.

17. A magneto-resistance effect device, comprising:
    a semiconductor region having a surface having a plurality of non-magnetic metal particles of a size equal to or smaller than 100 μm, the metal particles isolated from one another at intervals equal to or smaller than 1 μm;
    a semiconductor cap layer covering the semiconductor region and the non-magnetic metal particles so as to directly contact and embed the plurality of the non-magnetic metal particles; and
    a plurality of electrodes provided on a surface of the cap layer and separated from one another,
    wherein the semiconductor region, the plurality of non-magnetic metal particles and the semiconductor cap layer comprise no magnetic element.

* * * * *